United States Patent [19]
Spence et al.

[11] Patent Number: 5,317,425
[45] Date of Patent: May 31, 1994

[54] TECHNIQUE FOR USE IN CONJUNCTION WITH AN IMAGING SYSTEM FOR PROVIDING AN APPEARANCE MATCH BETWEEN TWO IMAGES AND FOR CALIBRATING THE SYSTEM THERETO

[75] Inventors: John P. Spence, Webster, N.Y.; Edward M. Granger, Sausalito, Calif.; Charles E. Rinehart, Pittsford, N.Y.

[73] Assignee: Eastman Kodak Company, Rochester, N.Y.

[21] Appl. No.: 834,076

[22] Filed: Feb. 10, 1992

[51] Int. Cl.$^5$ .............................. H04N 1/46
[52] U.S. Cl. .................. 358/504; 358/523; 358/535
[58] Field of Search ............... 358/77, 80; 356/388, 356/394, 390; 385/38, 504, 523, 535

[56] References Cited

U.S. PATENT DOCUMENTS

| | | | |
|---|---|---|---|
| 4,660,159 | 4/1987 | Ott | 364/526 |
| 4,665,496 | 5/1987 | Ott | 364/526 |
| 4,706,206 | 11/1987 | Benoit et al. | 364/526 |
| 4,708,459 | 11/1987 | Cowan et al. | 355/4 |
| 4,901,254 | 2/1990 | Dolezalek et al. | 364/526 |
| 4,958,220 | 9/1990 | Alessi et al. | 358/76 |
| 4,975,862 | 12/1990 | Keller et al. | 364/526 |
| 5,206,918 | 4/1993 | Levene | 382/17 |

OTHER PUBLICATIONS

"Gretag SPM50: A True Spectral Grating Spectrophotometer Offering the Operating Ease of a Densitometer", Gretag SPM50 spectrophotometer brochure.
F. Billmeyer, "Quantifying Color Appearance Visually and Instrumentally", *Summaries of Papers Presented at the Color Appearance Topical Meeting—Optical Society of America*, 29–30 Jun. 1987, Annapolis, Maryland, pp. 4–7.
W. Cowan, "The Computational Approach to Colour Reproduction", *Summaries of Papers Presidented at the Color Appearance Topical Meeting —Optical Society of America*, 29–30 Jun. 1987, Annapolis, Maryland, pp. 98–101.
J. Thornton et al., "High Resolution 'Paint by Number'", *Summaries of Papers Presented at the Color Appearance Topical Meeting—Optical Society of America*, 29–30 Jun. 1987, Annapolis, Maryland, pp. 104–105.
J. Rosenbau, "Semi-Automatic Generation of Film Compensation Tables", *Summaries of Papers Presented at the Color Appearance Topical Meeting—Optical Society of America*, 29–30 Jun. 1987, Annapolis, Maryland, pp. 111–114.
S. Guth et al., "Vector model for normal and dichormatic color vision", *Journal of the Optical Society of America*, vol. 70, No. 2, Feb. 1980, pp. 197–212.

*Primary Examiner*—Mark R. Powell
*Assistant Examiner*—Harold Burks, Jr.
*Attorney, Agent, or Firm*—Robert L. Randall

[57] ABSTRACT

Apparatus and associated methods employed therein, for objectively providing an accurate appearance match between images produced by two imaging systems (e.g. a target image produced by one such system, e.g. a press sheet (140) generated by a printing press (130), which is to be matched by a replica image produced by another such system, e.g. a proof (120) generated by a color halftone proofing system(110)) and thereby calibrate the performance of one imaging system, e.g. the proofing system, to that of the other system, e.g. the printing press. Specifically, measurement data, such as illustratively densitometric N,R,G,B measurements, is obtained for the same portions of the press sheet and proof. This data is then transformed into a color space which encodes color information in a pre-defined manner that approximates color preferences inherent in human color interpretation. Thereafter, through use of a pre-determined model of the proofing system, incorporated into pre-defined matching principles which objectively and quantitatively define an accurate appearance match between the images produced by both systems, changes in operational settings for the proofing system, such as solid area densities and tint dot areas, are determined which will calibrate the response of the proofing system to that of the press. Consequently, tone and color rendition produced by the proofing system is modified to provide an accurate appearance match to that obtained, from a common image source, on the press, given the judgmental preferences of a human observer and the performance limitations of the proofing system.

24 Claims, 7 Drawing Sheets

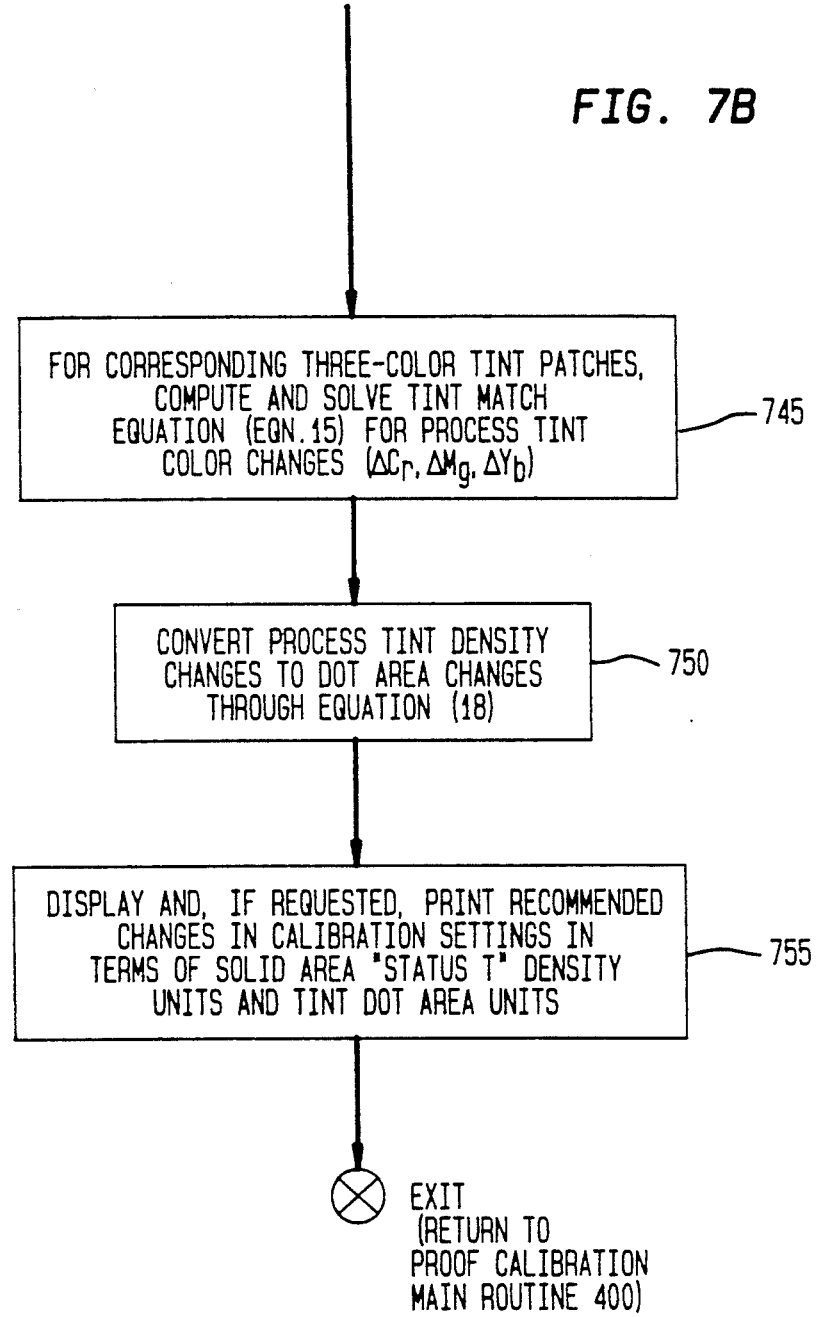

TECHNIQUE FOR USE IN CONJUNCTION WITH AN IMAGING SYSTEM FOR PROVIDING AN APPEARANCE MATCH BETWEEN TWO IMAGES AND FOR CALIBRATING THE SYSTEM THERETO

TECHNICAL FIELD OF THE INVENTION

The invention relates to a technique, specifically apparatus and associated methods employed therein, for objectively providing an accurate appearance match between a image produced by one imaging system (i.e. a "target" image produced by, e.g. a printing press) to the same image produced by a different imaging system (i.e. a "replica" of the target image but produced by, e.g., a halftone color proofing system) and thereby calibrate the performance of the latter system to that of the former system.

BACKGROUND ART

Currently, color images are generated through a wide variety of different systems, such as for example photographically on suitable film or photosensitive paper, or electronically on video tape or other suitable media. When generated, images share a basic characteristic: they are recorded on a continuous tone (hereinafter referred to as "contone") basis. As such, recorded color information at any point in the image is represented by several continuous amplitude values, each of which is oftentimes discretized as eight-bit values ranging from "0" to "255". Very often, a user having an image captured on one medium, such as a photographic print or transparency, will desire to display and/or reproduce that image on other media, such as on a video monitor or on a printed page.

Color reproduction equipment, as it relates to printing images, takes advantage of the principle that the vast majority of colors can be separated into a specific combination of four primary subtractive colors (cyan, yellow, magenta and black—C, Y, M and K) in which the amount of each primary color is set to a predetermined amount. In the case of printed reproductions of an image, use of primary color printing obviates the need to use a differently colored ink for each different color in the image. As such, each image is commonly converted into sets of three or four color separations, in which each separation is essentially a negative (or positive) transparency with an altered tone reproducing characteristic that carries the color information for only one of the primary colors. Separations are subsequently recorded on printing plates for use in a press.

By way of contrast, color reproduction on cathode ray tube displays takes advantage of the principle that the vast majority of colors can be represented by a combination of three primary additive colors (specifically red, green and blue—R, G and B) in which the intensity produced by each primary colored (R, G or B) phosphor is set to a predetermined amount.

Modern offset printing presses do not possess the capability of applying differential amounts of ink to any location in an image being printed. Rather, these presses are only designed to either apply or not apply a single amount of ink to any given location on a page. Therefore, an offset printing press is unable to directly print a contone separation. To successfully circumvent this problem, halftone separations are used instead. An image formed from any single color halftone separation encodes the density information inherent in a color image from amplitude modulated form into a spatial (area) modulated form, in terms of dot size, which is subsequently integrated by the human eye into a desired color. By smoothly changing halftone dot sizes (dot areas), smooth corresponding tone variations will be generated in the reproduced image. Given this, the art has taught for some time that a full color image can be formed by properly overlaying single color halftone reproductions for all of the primary subtractive colors, where each reproduction is formed from a corresponding halftone dot separation that contains dots of appropriate sizes. Clearly, as size and spacing of the dots decrease, an increasing amount of detail can be encoded in a halftone dot pattern and hence in the reproduced image. For that reason, in graphic arts applications, a halftone separation utilizes closely spaced dots to yield a relatively high resolution.

With this in mind, one might first think that printing a color image for graphic arts use should be a fairly simple process. Specifically, a color image could first be converted into corresponding continuous tone separations. Each of these contone separations could then be converted into a corresponding halftone separation. A printing plate could then be manufactured from each halftone separation and subsequently mounted to a printing press. Thereafter, paper or other similar media could be run through the press in such a fashion so as to produce properly registered superimposed halftone images for all the subtractive primary colors thereby generating a full color reproduction of the original image.

In practice, accurately printing a color image is oftentimes a very tedious, problematic and time consuming manual process that requires a substantial level of skill. First, the conventional manual photographic process of converting a contone separation into a halftone separation, this process commonly being referred to as "screening", is a time and resource consuming process in and of itself. Second, various phenomena, each of which disadvantageously degrades an image, often occur in a reproduced halftone color image. Moreover, the complete extent to which each of these phenomena is present in the reproduced image is often known only at a rather late point in the printing process thereby necessitating the use of tedious and time and resource consuming iterative experimentation to adequately eliminate these phenomena.

Traditionally, on-press proofing provided the first point at which a color judgment could be made regarding the quality of the reproduced image. For example, many color differences, such as incompatible and/or objectionable color renditions or Moire patterns, were usually first seen at this point in an imaging process. If such a difference were sufficiently objectionable to a color technician, then usually the entire imaging process would need to be modified and repeated. Doing so generally necessitated a total rework of the separations, production of a new set of printing plates therefrom and generation of a new press proof, with this process being iteratively repeated as many times as necessary to properly remove or sufficiently attenuate the incompatible and/or objectionable color differences.

In an effort to reduce the time required and expense associated with conventional manual photographic based color reproduction processes and particularly the traditional on-press proofing techniques used therewith, the art has turned away from use of on-press proofing in high volume graphic art applications and towards the use of intermediate off-press proofing technologies, such as electro-photographic techniques. In this regard, U.S. Pat. No. 4,708,459 (issued to C. Cowan et al on Nov. 24, 1987, assigned to the present assignee hereof and hereinafter referred to as the U.S. Pat. No. '459 Cowan et al patent) discloses an electro-photographic color proofing system (also referred to herein as a "proofer") with variable tone reproduction characteristics.

While the proofing system described in the U.S. Pat. No. '459 Cowan et al patent provides an excellent quality proof, this system, like all imaging systems, can reproduce colors only within a certain color gamut. Generally speaking, the tone reproduction characteristics of one type of imaging system, or even one type of imaging medium, are not completely coincident with those of a different type of imaging system or medium. In this regard through use of differing colorants (inks used in printing as compared to photographic dyes or colored phosphors on a video monitor) and other physical phenomena related to specific imaging processes, a given color shown on a color artwork, such as on a photograph, or on a press sheet printed on publication stock will often appear differently in a halftoned color proof formed on electro-photographic film and subsequently transferred to paper, the latter having characteristics similar to paper which will be used in a press. Furthermore, a halftone color proofing system, such as that described in the U.S. Pat. No. '459 Cowan et al patent, is generally incapable of producing the exact same color gamut and color response which are available through either the photograph or press sheet. In this regard, the color gamut reproducible in a color halftoned proof will generally not match that associated with a color artwork that appears on a photograph or on a press sheet. In addition and owing to physical differences among different imaging systems, the response of different types of imaging systems to an identical input color will likely be different, e.g. the same red color provided as input to two different imaging systems might likely produce two output colors with somewhat differing red hues.

In view of the inherent tone and color differences between, e.g., the press sheet and the proof thereof, the colors in the proof can not be identically matched to those that appear in the press sheet. Nevertheless, for a proofing system to fully serve its intended purpose, a proof image must accurately predict the image as subsequently printed on a press sheet. However, the tone and color reproduction characteristics of a proofing system rarely coincide with those of an associated press. Therefore, the tone and color reproduction characteristics of the proofing system must be calibrated, to the extent possible, to those of the press. Once calibrated, the proofing system should be able to accurately predict the performance of the press though, in most situations, it will generate a proof image with colors that do not exactly match those in the press sheet.

Unfortunately, calibrating a proofing system tends to consume an inordinate amount of time as well as require a very high level of skill. In this regard, a color technician is required to possess a substantial level of skill and expertise not only to judge color differences between a proof and a press sheet therefor but also to fully appreciate the performance inter-relationships between the colors that appear on the proof and the corresponding ones that will appear on the press sheet. Consequently, the technician not only must recognize a color difference and decide which specific colors to match but also, where the tone and color reproduction characteristics of the proofing system can be varied, determine the proper variations in these characteristics in order to achieve an acceptable match between the proof and the press sheet and then set the proofing system accordingly.

In particular, to calibrate a proofing system to a press, a color technician usually visually examines both a proof and the associated press sheet on a side-by-side basis and then, based upon his own subjective judgment as to what the visually important features of the press sheet are and how they should appear, selects which colors to match. Thereafter, given his knowledge of the response of the proofing system and its color response, he will attempt to initially vary the C, Y, M and K colorant solid area densities and/or dot size (tone reproduction curve) settings to accurately depict one color(s), which, not surprisingly, will also affect other colors, possibly adversely. Based upon the effects that occur with respect to other colors in the proof, the technician will iteratively vary the solid area densities and/or dot size (tone reproduction curve) settings of the colorants, in seriatim, until an acceptable color match is achieved between the press sheet and the proof for the selected colors.

However, a proofing system with variable tone and color reproduction characteristics often presents the technician with an enormous number of different possible combinations of the settings. For example, for the system described in the U.S. Pat. No. '459 Cowan et al patent, the solid area density and dot size can be set for each of the four process colors (C, Y, M and K) at any of 20 different density levels and at any of 15 different dot size settings. In view of the resulting huge number of potential combinations of settings, an experienced color technician often needs to run and separately analyze quite a few successive proofs in order to select a suitable solid area density and halftone dot size setting for each different colorant in order to achieve an acceptable match between the proof and a press sheet and thereby calibrate the proofing system to the press. Moreover, additional time is consumed whenever the technician is forced to resort to trial-and-error experimentation or, in a worst case scenario, guesswork: either merely as a result of iterating through a very large number of possible combinations to discern the performance inter-relationships of the proofing system and/or by incorrectly relying on intuition and initially iterating away from a proper operating condition. An example of the latter situation can occur where the technician, based upon his own intuition, views a proof against a press sheet and decides that the yellow content in the proof needs to be increased. While the technician may decide to initially increase the halftone dot size for the yellow colorant, the proper operating condition may instead involve reducing the halftone dot sizes for all the colorants but reducing the halftone dot size for yellow less than that for each of the other colorants.

Furthermore with certain images, the technician may simply have insufficient skill to quickly determine the proper operating conditions of the proofing system. As such, in certain situations, the technician, given his lack of knowledge or experience, may be unable to determine the best possible color match in the time allotted and thus must settle for one that is often simply acceptable. In view of this, empirical approaches have been developed to aid the technician in quickly locating a limited region of the operating space of the proofing system in which a decent match can be achieved to which the proofing system can be calibrated. One such empirical approach could involve first matching the C, M, Y and K solid area and halftone densities between the press sheet and the proof to the extent realistically possible—though this may generally produce mis-matches in overprint colors, e.g. the reds, greens and blues. Once these primary color matches are achieved, the resulting proof is then visually examined to determine how certain overprint colors appear, e.g. whether the gray tones are the same as on the artwork or are too red. If the latter occurs, then the colorants are appropriately changed, possibly through successive iterative changes, to increase the cyan content or decrease the magenta and yellow content in the proof. Alternatively, the technician could visually examine the reds in the proof. If the reds appear too orange, the colorants could be appropriately changed to decrease the yellow content of the proof or alternatively increase its magenta content. In that regard, it is widely known that an average human vision is acutely sensitive to flesh tones (which specifically contain red hues). Hence, even a subtle difference in coloration may be perceived as transforming an otherwise pleasant image of a human face into one that is quite unnatural and obnoxious. Through such approaches, even a skilled color technician may still need to generate upwards of 12-15 separate proofs in seriatim, typically requiring a full day of work, until he discerns the proper operating condition of the proofing system which is needed to achieve an acceptable color match between the proof and a press sheet therefor and thereby calibrate the proofing system to the press in use.

Through a totally different approach, the technician could quantitatively measure reflection densities of selected portions of the image on both the press sheet and the proof using, for example, a reflection densitometer, and then attempt to set the colorants in a manner that seeks to achieve the densities inherent in the press sheet. Unfortunately, this approach is constrained by the ability of the technician to locate corresponding relatively large uniformly colored areas on both the press sheet and the proof at which the reflection densitometer can be reliably placed to take measurements. If both images contain significant detail, then suitable measurement areas may not exist and thereby preclude such densitometric measurements from being made.

Apart from a reflection densitometer, one device that has recently become available for color measurement and matching is a spectrophotometer, such as the Model SPM 50 spectrophotometer manufactured by Gretag Corporation of Bothell, Wash. This device projects white light onto an image and then separates the spectrum of reflected light from the image through a diffraction grating and measures the intensity of the reflected radiation at a number of different wavelengths. Through this device and its associated software, colorimetric spectral based measurements can be made of any reflection image. Though this device is intended to be used to determine proper halftone dot size in the separations in order to achieve a desired coloration in the reflection image therefrom, conceivably it could be used to characterize (i.e. "model") a proofing system in use and then effectuate a color balance between a press sheet and a proof therefor. Specifically, a set of known test (reference or calibration) separations is provided with the device, and dot area settings for these separations are stored within the device. To characterize the proofing system, a proof is made from the reference separations. Thereafter, spectrophotometric measurements are taken of this particular proof. The resulting measurements, when processed, would yield a model that characterizes the color gamut producible through the proofing system. Thereafter, in order to generate a color match to a press sheet, the device could then be used to take spectrophotometric measurements of the press sheet. Given the characterization of the proofing system and the latter set of measurements, the software will determine appropriate values to use for solid area densities and corresponding halftone dot sizes for each primary colorant in the proofing system in order to generate a proof that should match the press sheet.

Inasmuch as the color gamut reproducible through a proofer does not coincide with that appearing in the press sheet, the software used with this device is constrained, just as the technician is in manually performing a color match, to effectuate a compromise in matching the two gamuts between the press sheet and the proof therefor. In achieving a color match, this software relies on the well-known CIELAB L*,a*,b* color coordinate system and color differences associated therewith. In computing a color match, the software seeks to minimize an overall $\Delta E$ value (i.e. the sum of the squares of the CIELAB color difference values) between the two color gamuts and thus obtain a "colorimetric" match.

In this regard, a very small colorimetric difference for some colors will lead to a very large $\Delta E$ value; while this will not be true for other colors. Any system, such as the Gretag spectrophotometer, that seeks to minimize an overall colorimetric error between two images produced by systems with differing tone and color reproduction characteristics may well still produce minor color mismatches for some colors that, in various image contexts, would be highly objectionable to a human observer.

In particular, it has been known for some time that human color perception, including mental judgment, exhibits differing sensitivities for different colors. Given this, human observers will be much more acutely aware of what would amount to minor color differences, such as differences in so-called "memory" colors (e.g. greens and flesh tones), in certain pictorial contexts than in others. Accordingly, a color difference that would simply be noticeable, if at all, in some contexts would be highly objectionable in others. For example, people are acutely aware of very small differences in flesh tones. A viewer will likely object to a human face that appears too blue or green, while merely noticing, if at all, and certainly not objecting to a tablecloth or blanket that exhibited the same variation. Thus, an effective color balance needs to account for the preferences inherent in human color perception. Specifically, if a press sheet is compared side-by-side to an accurate proof thereof, a viewer should reach the conclusion that the proof in effect has a good appearance, i.e. flesh tones appear as they should as well as do other colors given the context of the image thereon. In this instance, the relative coloration throughout the proof is pleasing even though the specific hues in the proof will not necessarily identically match those in the press sheet. Such a visually pleasing match between, for example, a proof and a press sheet will hereinafter be referred to as an "appearance match".

Any system that attempts to provide a uniform "colorimetric" match across all colors totally ignores the innate preferences inherent in human color interpretation. Consequently, the resulting proof, based solely on a colorimetric match to the press sheet, is likely to contain minor color differences, that depending upon the context of the particular image, can be highly objectionable to a viewer. Consequently, the proof would not be a visually appealing representation of the press sheet. In these instances, a colorimetric based approach to color matching will clearly yield an unsatisfactory match that simply can not be used to calibrate a proofing system. When this occurs, a color technician would likely revert back to a manual approach to locate what he subjectively perceives to be an appearance match between the press sheet and the proof—but will be forced to accept a rather high cost in time and material to do so.

As one can now appreciate, thus far the art has simply failed to provide a relatively fast systematic technique for objectively and automatically achieving a satisfactory appearance match between one color image, such as a press sheet, and another image, such as a proof therefor, for nearly all images, and particularly for use in calibrating one imaging system, such as a proofer, to another, such as a press.

Furthermore, proofs are typically printed, particularly through the proofing system described in the U.S. Pat. No. '459 Cowan et al patent, with so-called "run bars" that appear alongside the proof image. Each run bar provides a pre-defined sequence of color test patches composed of various combinations of primary colors, both as solids and halftones, as well as other diagnostic targets. These bars are intended to provide test areas for taking densitometric measurements of areas of uniform colors. For example, a typical run bar will contain, among others, separate solid and 50% input color patches for the K, C, M and Y primary colors; separate solid color patches for the red (M and Y overprint), green (C and Y overprint), blue (C and M overprint) and three-color overprints (C, M and Y); and a 50% input color patch for a three-color overprint. Inasmuch as these bars exist alongside the proof and are formed by the proofing process using the same colorants as in the proof itself, these bars identically represent the result of the proofing system tone and color reproduction characteristics in the proof. Given the existence of the run bars in proofs, particularly those produced through the proofing system described in the U.S. Pat. No. '459 Cowan patent, it would be highly desirable to utilize these bars in some fashion to effectuate a color match between the proof and a press sheet. Similar run bars exist on a press sheet.

Therefore, a need currently exists in the art for a technique, specifically though not exclusively intended for inclusion in a proofing system, that can be used, particularly in conjunction with run bars or other simple test objects, to quickly, objectively and automatically provide an appearance match between an image produced by one imaging system, such as a proof, and another image, such as a press sheet, produced therefor but from a different imaging system. While the colorations in such a match will rarely be identical due to differences in reproducible color gamut and color response between these two systems, the match attained through this technique should nevertheless result in, for example, a proof that is, in substantially all instances, a visually accurate and appealing representation, i.e. an appearance match, of a press sheet. Moreover, by automatically providing a match through objective criteria, such a technique should significantly reduce the trial-and-error effort and the degree of skill required of a user, as well as the associated time and cost, needed to achieve such a match and thereby calibrate a proofing system to a press.

DISCLOSURE OF THE INVENTION

Accordingly, an object of our present invention is to provide apparatus and associated methods, for use in illustratively a proofing system, that will objectively provide an appearance match between two images, such as a press sheet and a proof therefor.

A specific object is to provide such a match relatively quickly and automatically based on measurements, such as illustratively densitometric, taken of both images.

Another specific object is to provide such a match in a manner that demands less skill and expertise of a user than has heretofore been required in the past.

Another specific object is to provide such a match in much less time and at significantly less cost than has heretofore been required in the past.

Another specific object is to provide such a match through use of run bars or other simple test objects, that appear on both images.

Another object is to provide a technique for calibrating one imaging system, such as the proofing system, to another, such as a press, based on the appearance match attained for two images associated therewith, such as, for example, between a press sheet and a proof therefor.

These and other objects are achieved in accordance with our inventive teachings by first obtaining data, such as illustratively "Status T" densitometric measurements, for the same portions of two corresponding depictions of a common image but produced by different first and second imaging systems (i.e. a target image produced by one imaging system, such as a press sheet generated by a printing press, which is to be matched by a replica image produced by another imaging system, such as a proof generated by a color halftone proofing system). This data is then transformed into a color space which encodes color information in a pre-defined manner that approximates color preferences inherent in human color interpretation. Thereafter, through use of a pre-determined model of the second imaging system, incorporated into pre-defined matching principles which objectively and quantitatively define an accurate appearance match between images produced by both imaging systems, operational settings (particularly changes therein) for the second imaging system, e.g. the proofing system, such as colorant solid area and tint densities, are determined which will calibrate the response of this system to that of the first imaging system, e.g. the press. Through this methodology, tone and color renditions produced by the second imaging system are modified to provide an accurate appearance match of those obtained from a common image source on the first imaging system, given the judgmental preferences of a human observer and the performance limitations of the second imaging system. For example, the operational settings of a proofing system would be altered in a manner which will produce a proof that is an accurate appearance match to the target image produced by a printing press or alternate proofing system.

To obtain a proper set of operational settings in relatively short time, the model and matching principles are combined to yield feedback-based equations which, if necessary, can be iteratively processed with transformed measurement data from each of a succession of proof images. In this manner, operational settings are determined for an initial proof and a replica image; the operating condition of the second system, i.e. the proofing system, is then set in accordance with these settings; and a new proof is generated. This process is then repeated, if needed, with a new operational settings being produced and used to subsequently set the proofing system, and so on, until the operational settings appropriately converge, such as within a pre-defined convergence limits, at which point the proof does appear to a user to be an accurate "appearance match" to the press sheet.

In accordance with a preferred embodiment of our invention, specifically one directed to use with an electro-photographic proofing system, our technique relies on first obtaining measurements, typically well known "Status T" densitometric measurements, of corresponding test patches of the same image but printed on a press sheet and on a halftone proof therefor. These measurements are then transformed into a color space, illustratively the well known a-t-d color space, that approximates the response of human color interpretation. Thereafter, using pre-defined matching principles as well as a process color model (based upon illustratively sensitivity coefficients of locally linearized empirical performance data) of the performance of the proofing system, incremental changes in the operating conditions (specifically changes in solid area densities for the process color solids and halftone dot sizes for process color tints) are determined which, when fed back to the proofing system, effectuate an appearance match between the proof and a corresponding press sheet. As such, the proofing system will be calibrated to the performance of press and thus will accurately predict on an "appearance match basis" the subsequent response of the press, at its current operating conditions, to different images subsequently provided, through halftone separations, to both the proofing system and the press.

Advantageously, our inventive technique automatically and objectively provides an accurate appearance match between two images and therethrough calibrates one imaging system, such as a proofer, to another, such as a printing press, in a manner that is significantly faster and less expensive, and requires substantially less user expertise than both trial-and-error methods, that have heretofore found use in the art, and quantitative colorimetric based methods.

BRIEF DESCRIPTION OF THE DRAWINGS

The teachings of the present invention may be readily understood by considering the following detailed description in conjunction with the accompanying drawings, in which:

FIG. 7 depicts the correct alignment of the drawing sheets for FIGS. 7A and 7B; and FIGS. 7A and 7B collectively depict a flowchart of Compute Calibration Routine 700 that is also executed by routine 400 shown in FIG. 4.

To facilitate understanding, identical reference numerals have been used, where possible, to denote identical elements that are common to various figures.

MODES OF CARRYING OUT THE INVENTION

After reading the following description, those skilled in the art will readily appreciate that our present invention can be used in a wide variety of different imaging systems to objectively provide an appearance match between a image produced by one such system (i.e. a "target" image) to the same image produced by a different imaging system (i.e. a "replica" of the target image) and thereby calibrate the latter system to the former. In general, differing imaging systems, as well as the media which depict these images, have differing tone and color reproduction (color gamut and response) characteristics. As such, the coloration of the replica image will rarely match that of the target image throughout the entire color space of either image. For example, flesh tones, which are predominantly red hues, depicted in one image medium, such as a transparency, may not appear to have the same color on another image media, such as a halftoned color image that is printed on a page, while other colors will match. However, since our inventive technique provides a color match that is sensitive to the manner through which colors are perceived and differences through which colors are judged by human observers, the replica image will be a visually pleasing, though not necessarily identical, depiction of the appearance of the target image. With this in mind and to simplify the following discussion, our invention will now be discussed in the context of use in halftone color printing apparatus, having a halftone proofing system and a printing press, for generating a halftoned color proof (being the "replica" image) that has an appearance match to a press sheet (being the "target" image) generated by the press and for calibrating the proofing system (also referred to herein as a "proofer") to the press.

A. Overall Halftone Color Printing Apparatus

Figure 1:
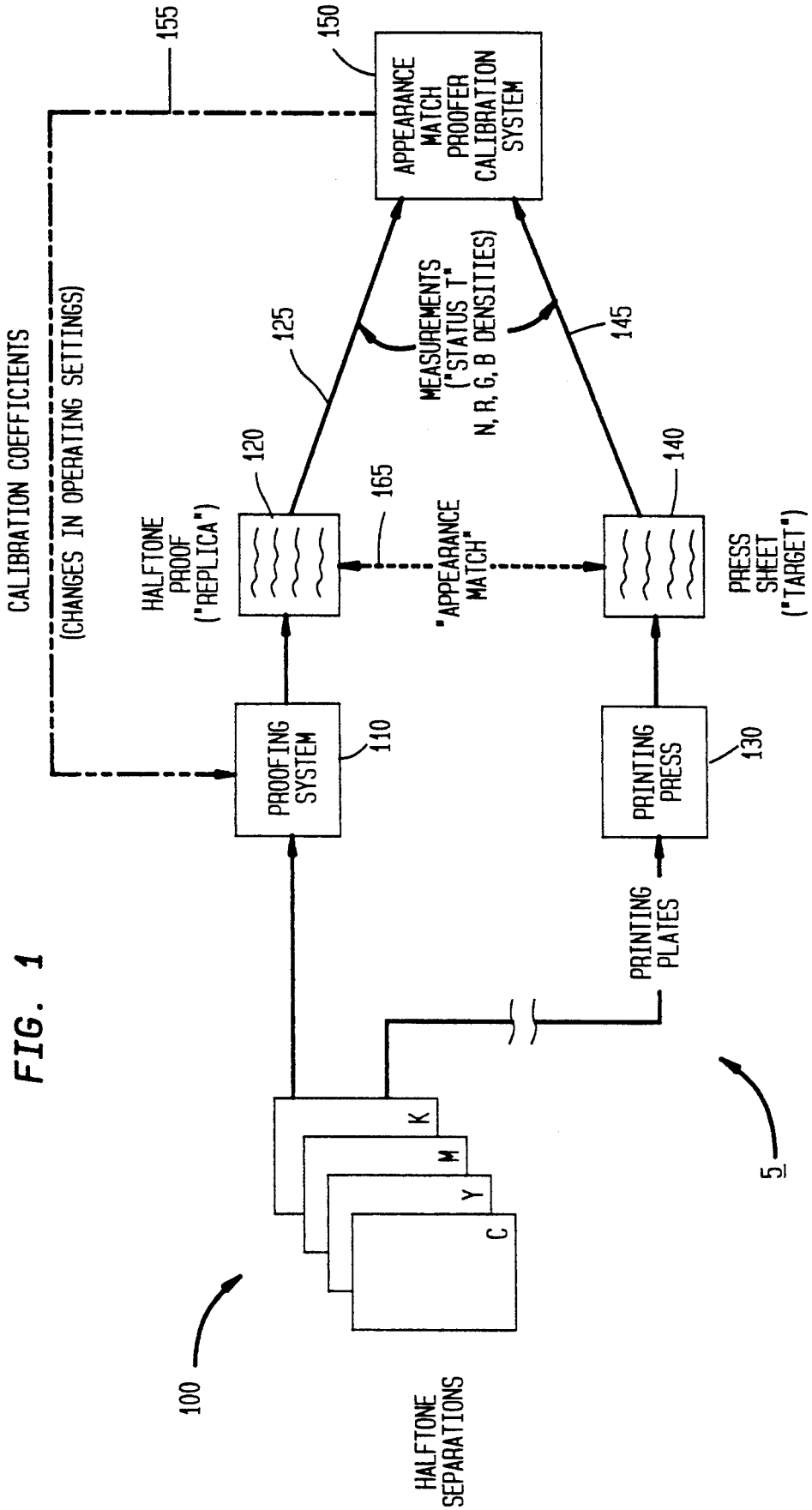
FIG. 1 is a high level block diagram of halftone color printing apparatus 5 that incorporates our present invention.

FIG. 1 shows a high level block diagram of halftone color printing apparatus 5 that incorporates our present invention. As in conventional printing systems, system 5 contains off-press proofing system 110 and printing press 130. In order to print a halftone color image of a continuous tone ("contone") original image, e.g. an artwork, through apparatus 5, a set of (screened) halftone separations 100 is made for this image. This set typically contains a separate separation for each subtractive primary color: cyan (C), yellow (Y), magenta (M) and black (K). These separations will eventually be formed, through processes not shown or relevant here, into a set of printing plates which, in turn, is used within press 130 to print multiple reproductions of the halftone color image on, for example, publication stock. In an effort to significantly reduce, inter alia, the time, tedium and expense associated with generating an acceptable halftone reproduction of the contone image, proofing system 110 is utilized to generate color halftone proof 120. The proof is intended to provide an accurate and predictive representation of a press sheet, such as sheet 140, which would be produced by printing press 130. Undesirable image artifacts or color differences that would otherwise appear on the press sheet should first appear in the proof. Through judicious changes made, typically on an iterative basis, to one or more of the halftone separations, a color technician is expected to be able to entirely eliminate these artifacts and differences or at least render them sufficiently invisible to an human observer prior to undertaking the time and expense associated with producing a set of printing plates from separations 100 for use in press 130.

Our invention is particularly (though certainly not exclusively) applicable to use in an electro-photographic proofing system with variable tone reproduction characteristics, such as that described in U.S. Pat. No. 4,708,459 (issued to C. Cowan et al on Nov. 24, 1987, assigned to the present assignee hereof and hereinafter referred to as the U.S. Pat. No. '459 Cowan et al patent) which is incorporated by reference herein. For purposes of simplicity, our invention will be discussed in that context. In such a proofing system, each separation is essentially a negative (or positive) transparency with an altered tone reproducing characteristic that carries the color information for only one of the primary colors. However, our invention can easily be used in connection with direct digital color proofing systems, in which case each halftone separation would be a data structure of bit-mapped binary values, as well as in a wide variety of other imaging systems.

In any event, to sufficiently reduce the effort and expense associated with generating acceptable printed halftone reproductions of a color image, halftone proof 120 should accurately predict how an image captured on halftone separations 100 would appear on the press sheet. In this regard, the response of proofing system 110 shown on proof 120 to a set of halftone separations must accurately reflect the response of printing press 130 shown on press sheet 140 to the same set of separations.

Inasmuch as the imaging process used by system 110 for producing halftoned images formed on electro-photographic film and subsequently transferred to paper (the paper having characteristics similar to the paper which will be used in a press) differs, in this case significantly, from that used by press 130 to produce an image on publication stock, proofing system 110 and press 130 will reproduce colors within different color gamuts as well as possess different color responses. Accordingly, the tone and color reproduction characteristics of proof image 120 will not coincide with those of the image on press sheet 140. As such, an area on a given set of separations 100 derived, for example, from a particular red hue in an artwork, when applied to both proofing system 110 and press 130, will likely produce different red hues in a proof and a press sheet.

In view of the inherent tone and color differences between the press sheet and the resulting proof thereof, the colors in the press sheet can not be identically matched by those that will appear in the proof. Nevertheless, for a proofing system to fully serve its intended purpose and be accurately predictive of a press, the tone and color reproduction characteristics of the proofing system must be calibrated, to the extent possible, to those of the press. Once calibrated, the proofing system should be able to accurately predict the performance of the press though, in most situations, it will generate a proof image with colors that do not exactly match those in the press sheet.

Traditionally, a color technician performed this calibration by manually comparing a press sheet and a proof image therefor, on a side-by-side, basis to determine how to effectuate a proper "appearance" match between these images. Such a match, while not exact in color rendition, would result in a proof that was visually pleasing (i.e. had a "good appearance") and which accounted, to the extent possible, for preferences inherent in human color interpretation. Unfortunately, finding an appearance match between two images often required an inordinate amount of time and a very high level of skill. First, the technician was required not only to critically judge color differences between proof 120 and press sheet 140 but also to fully appreciate the performance inter-relationships between the colors that appeared on the proof and the corresponding ones that would appear on the press sheet. Second and equally important, the technician was also required not only to decide, based upon the specific image content, which particular colors to match but also to determine what the proper variations in the tonal reproduction characteristics of proofing system 110 would be in order to achieve an acceptable match between the proof and the press sheet and then set the operating characteristics (e.g. solid area density and halftone dot sizes for each process color) of the proofing system accordingly.

Inasmuch as proofing system 110 generally provided an extremely large number of different possible combinations of solid area density and halftone dot sizes across all the process colors, an experienced color technician often needed to run successive proofs and iteratively change the settings until he found a particular combination that yielded an acceptable appearance match between the proof and the press sheet. While in most cases, the technician was able to iteratively converge on a suitable combination through directed trial-and-error experimentation, in some cases, the technician was simply forced, based upon the context of the image and the colors used therein, to resort to mere guesswork. Furthermore, with certain images, the technician simply had insufficient skill to quickly determine the proper operating conditions of the proofing system, and owing to time constraints, was forced to settle for a color match that was not the best possible but rather was merely acceptable. Not surprisingly, over the years, empirical procedures have been developed for use by the technician to reduce the time required to locate a proper color match. However, even with these procedures, a skilled color technician still required upwards of 12-15 proofs, ordinarily a full day of work, to determine the proper calibration settings needed to achieve an acceptable color match between the proof and a press sheet therefor and thereby calibrate proofing system 110 to press 130. Moreover, other techniques, such as those which would rely on spectrophotometric comparisons and matching through use of the well known CIELAB color difference standards, would tend to yield colorimetric matches that, in many instances, were very poor appearance matches.

Hence, in accordance with the teachings of our invention, we have devised a technique for objectively, automatically and quickly determining a highly acceptable appearance match between two depictions of the same image but produced through two different imaging systems, such as between proof 120 and press sheet 140, and, based upon such a match, calibrating one of these systems to the other, e.g. calibrating proofing system 110 to press 130. Through use of our technique, the proof image will accurately represent, though not identically match but nevertheless be a more useful as well as a visually pleasing depiction of, the press sheet.

In general, our technique relies on incorporating our inventive appearance match proofer calibration system 150 into printing apparatus 5. System 150 obtains measurements, typically well known "Status T" densitometric measurements as symbolized by lines 125 and 145, of corresponding test patches of the same image but printed on a halftone proof and on a press sheet therefor. Based upon these measurements, system 150 transforms these measurements into a color space, illustratively the well known a-t-d color space, that approximates the response of human color interpretation. Thereafter, using pre-defined matching principles as well as a process color model (based upon illustratively sensitivity coefficients) of the performance of proofing system 110, system 150 determines incremental changes in the operating conditions (specifically solid area densities for the process color solids and halftone dot sizes for process color tints) which, when fed back (as symbolized by dashed line 155) to proofing system 110, effectuate an appearance match, as symbolized by dashed line 165, between proof 120 and press sheet 140. As such, proofing system 110, with its operating conditions so changed, will be calibrated to the performance of press 140 and thus will accurately predict on an "appearance match basis" the subsequent response of the press, at its current operating conditions, to different images subsequently provided on separations 100.

B. A-T-D Color space

The a-t-d color space represents (encodes) colors in a manner that appears to closely approximate human color judgment: i.e. based upon two-color differences rather than on individual colors. This color space has three dimensions, one of which, the "a" dimension, is achromatic, while the other two, "t" and "d", are chromatic. For a detailed description of this color space, see, e.g., S. L. Guth et al, "Vector Model for Normal and Dichromatic Color Vision", *Journal of the Optical Society of America,* Vol. 70, No. 2, February 1980, pages 197–212. "Status T" R,G,B reflection density values, after correcting for a reference white by subtracting corresponding channel paper base densities, can be readily transformed into the a-t-d color space through use of matrix equation (1) as follows:

$$\begin{bmatrix} a \\ t \\ d \end{bmatrix} = \begin{bmatrix} \frac{1}{4} & \frac{3}{4} & 0 \\ -\frac{\sqrt{3}}{2} & \frac{\sqrt{3}}{2} & 0 \\ -\frac{1}{2} & -\frac{1}{2} & 1 \end{bmatrix} \begin{bmatrix} r \\ g \\ b \end{bmatrix} \quad (1)$$

where:
"a" represents an intensity measure in the image, i.e. the perceived "lightness" or "darkness" in the image;
"t" represents a red-green color difference with a perceived emphasis on red rather than green; and
"d" represents a yellow blue color difference with a perceived emphasis on yellow rather than blue.

As such, through the transformation embodied in equation (1), three-dimensional densitometric red, green, blue (R, G, B) color values are mapped into a single (t,d) color plane with an overall intensity measure as the third dimension. Appropriate pseudo-code for implementing equation (1), as well as for each of the following equations, will be provided hereinbelow. Although we have found that our invention can provide excellent results through use of the a-t-d color space with "Status T" densitometry data, our invention can be used with a wide variety of other color spaces and other input sources, such as the CIELAB color space and XYZ colorimeters, provided proper attendant matching principles and process models are used.

C. Matching Principles

We have determined that, while the color gamuts and color responses reproducible through the press sheet and proof are different, an accurate appearance match between the press sheet and the proof can be obtained by matching several distinct items in both images.

First, for the C, Y and M solid process colors, we separately match: (1) the lightness ("a") coordinate for the three-color solid overprint test patches in both the press sheet and the proof, and (2) the hue angle (governed by the "t" and "d" coordinates) of the solid red test patches and the hue angle of the solid green test patches in both the press sheet and the proof. Through use of an "a" coordinate match in the near neutral three-color overprint patch, the overall contrast in the press sheet is preserved in the proof: shadows appear dark and highlights appear bright. In addition, hue angle matching in the "t-d" plane assures red and green appearance color matching which results in proper appearance matches for many colors for which very minor differences are nevertheless acutely objectionable to human observers, i.e. the so-called "memory" colors. The red test patch is formed as a two-color overprint of magenta and yellow; the green test patch is formed as a two-color overprint of cyan and yellow. As such, reds and greens in the proof have the same hue, though not necessarily the same chromaticity, as in the press sheet. By securing such a match for solid reds and greens as well as a match in overall intensity, the proof will possess correct contrast and a proper range of color rendition.

Second, the densities, expressed in a-t-d coordinates, of the three-color tint overprints, at preferably a 50% dot size, in the press sheet and the proof are also matched for all three coordinates. Inasmuch as the a-t-d coordinate space is a direct 1:1 linear mapping of the r-g-b color space, tint matching can also be performed directly in r-g-b color space. Matching this item provides a match in tint lightness and in lack of neutrality in the near neutral three-color overprint tone scale.

Third, since black is often used as a separate process color (in view of general use of non-balanced C, Y and M process inks as well as cost considerations), for gray replacement and to accentuate shadows and text thereby providing an extended color gamut, an achromatic ("a" coordinate) match is also made in terms of "N-channel" density for solid black and black tint, the latter being at a 50% dot size, between the proof and the press sheet.

While color matching using these criteria will clearly not yield a proof that is a colorimetric match to a press sheet but rather a proof that is clearly skewed towards accurate red and green color rendition, the image in the proof will, in view of the innate preferences in human color interpretation, provide an accurate appearance match to the image in the press sheet.

With the above in mind, we shall now discuss the mathematical equations that embody these principles. These equations are presented in feedback form. The equations signify raw or transformed densitometric data by the notation $X_z^Y$ wherein X is a particular pure colorant or overprint (either "K", "C", "M", "Y", "N", "R" or "G" for black, cyan, magenta, yellow, three-color, red and green, respectively), y is the data source (either "T" for target, here being the press sheet, or "P" for proof, i.e. the replica), and z signifying either a density channel ("n", "r", "g" or "b") or color space coordinate ("a", "t" or "d") as appropriate. Corresponding changes in an operating characteristic in the proof are indicated by $\Delta X_z$.

As noted above, solid C, M and Y process color matching entails "a" coordinate matching for the three-color overprints and red and green hue angle matching for the M and Y overprint and the C and Y overprint. With the above notation in mind, three-color overprint "a" coordinate matching is embodied in equation (2) below:

$$N_a^T - (N_a^P + \Delta N_a) = 0 \tag{2}$$

Simply stated, the correction, $\Delta N_a$, needed in the three-color overprint achromatic coordinate is the difference between the transformed amounts for the measured press sheet and proof.

Hue angle matching is given by equations (3) and (4) below:

$$R_t^T(R_d^P + \Delta R_d) = R_d^T(R_t^P + \Delta R_t) \tag{3}$$

$$G_t^T(G_d^P + \Delta G_d) = G_d^T(G_t^P + \Delta G_t) \tag{4}$$

Figure 2:
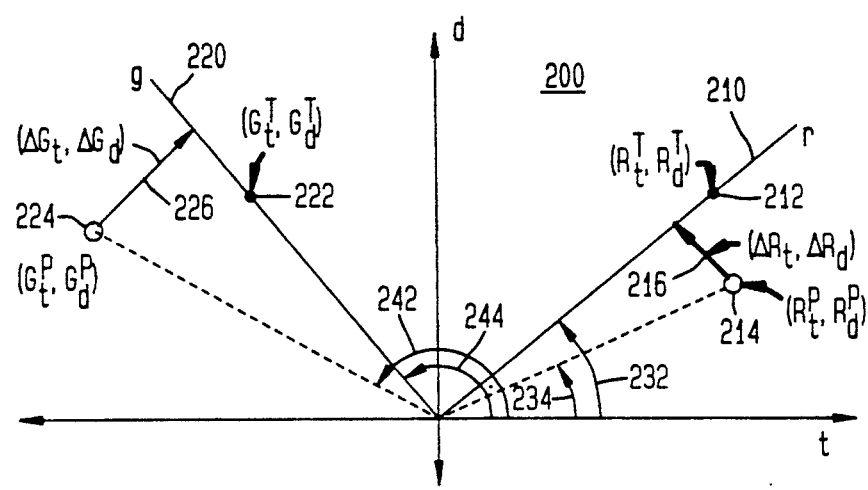
FIG. 2 is a graphical and conceptual depiction of the principle of two-color red and green "t-d" coordinate hue angle matching as used in our present invention.

To fully understand hue angle matching, consider FIG. 2 which graphically and conceptually depicts the principle of two-color red and green "t-d" coordinate hue angle matching as used in our present invention. Within "t-d" plane 200, the solid red and green colors for the press sheet (target), when plotted therein, appear as points 212 ($R_t^T, R_d^T$) and 222 ($G_t^T, G_d^T$) respectively. These points define, with respect to the positive t-axis, corresponding lines 210 and 220 of constant hue angles 232 and 244, respectively. The specific red and green colors in the proof, when plotted in plane 200, are denoted by points 214 ($R_t^P, R_d^P$) and 224 ($G_t^P, G_d^P$) which lie on corresponding dashed lines emanating from the origin and define hue angles 234 and 242, respectively. In order to match the hue angles of the solid red and green t-d coordinates between the press sheet (the target "T") and the proof, an amount of movement, ($\Delta R_t$, $\Delta R_d$) for the red solid and ($\Delta G_t$, $\Delta G_d$) for the green solid, is determined, through an equal ratio rule, which, when added to the proof solid red and green coordinates, will move these coordinates onto the red and green hue lines 210 and 220 for the press sheet and force the proof to exhibit solid red and green with respective hue angles 232 and 244. Equations (3) and (4) separately define the coordinate movements for the red and green solids.

As to the three-color tint overprints, a three-dimensional coordinate change ($\Delta N_a$, $\Delta N_t$, $\Delta N_d$) is determined which will simply match the proof to the press sheet. This matching principle is embodied in equations (5), (6) and (7) below:

$$N_a^T - (N_a^P + \Delta N_a) = 0 \tag{5}$$

$$N_t^T - (N_t^P + \Delta N_t) = 0 \tag{6}$$

$$N_d^T - (N_d^P + \Delta N_d) = 0 \tag{7}$$

These equations are evaluated at a 50% dot size. As noted above, a match in all three a-t-d coordinates is equivalent to a match in the r-g-b color space. As such, no particular advantage accrues from use of the a-t-d coordinates in equations (5)–(7).

Now, as to the black solid and tint (e.g. at 50% dot size) matches, a simple achromatic match is separately evaluated for each condition. This match is embodied in equation (8) as follows:

$$K_a^T - (K_a^P + \Delta K_a) = 0 \tag{8}$$

D. Proofing System Model

To implement the matching principles embodied in equations (2)–(8), a model must be constructed of proofing system 110 (see FIG. 1). In order to provide a proper appearance match between proof 120 and press sheet 140 by iteratively applying changes in operational settings of proofing system 110 provided by proofer calibration system 150 through use of measurements of successive sets of corresponding proofs and press sheets, the proofing system is characterized in the form of a feedback model. Furthermore, the model expresses changes in responses, such as three-color lightness, in terms of changes in C, Y and M process color (solid and tint) densities and specifically those changes which are needed in these densities to bring about the desired coloration changes in the proof.

With this in mind, the response of the proofing system can be modeled as given by equations (9)–(13) below, where in each equation S represents a matrix of predetermined sensitivity coefficients:

(i) for the three-color solid overprints $$\Delta N_a = \begin{bmatrix} \frac{\partial N_a}{\partial C} & \frac{\partial N_a}{\partial M} & \frac{\partial N_a}{\partial Y} \end{bmatrix} \begin{bmatrix} \Delta C_r \\ \Delta M_g \\ \Delta Y_b \end{bmatrix} = [S_{Na}] \begin{bmatrix} \Delta C_r \\ \Delta M_g \\ \Delta Y_b \end{bmatrix} \tag{9}$$

(ii) for the red and green solid colors $$\begin{bmatrix} \Delta G_t \\ \Delta G_d \end{bmatrix} = \begin{bmatrix} \frac{\partial G_t}{\partial C} & \frac{\partial G_t}{\partial M} & \frac{\partial G_t}{\partial Y} \\ \frac{\partial G_d}{\partial C} & \frac{\partial G_d}{\partial M} & \frac{\partial G_d}{\partial Y} \end{bmatrix} \begin{bmatrix} \Delta C_r \\ \Delta M_g \\ \Delta Y_b \end{bmatrix} = \begin{bmatrix} S_{Gt} \\ S_{Gd} \end{bmatrix} \begin{bmatrix} \Delta C_r \\ \Delta M_g \\ \Delta Y_b \end{bmatrix} \tag{10}$$

$$\begin{bmatrix} \Delta R_t \\ \Delta R_d \end{bmatrix} = \begin{bmatrix} \frac{\partial R_t}{\partial C} & \frac{\partial R_t}{\partial M} & \frac{\partial R_t}{\partial Y} \\ \frac{\partial R_d}{\partial C} & \frac{\partial R_d}{\partial M} & \frac{\partial R_d}{\partial Y} \end{bmatrix} \begin{bmatrix} \Delta C_r \\ \Delta M_g \\ \Delta Y_b \end{bmatrix} = \begin{bmatrix} S_{Rt} \\ S_{Rd} \end{bmatrix} \begin{bmatrix} \Delta C_r \\ \Delta M_g \\ \Delta Y_b \end{bmatrix} \tag{11}$$

(iii) for the three-color tint overprints $$\begin{bmatrix} \Delta N_a \\ \Delta N_t \\ \Delta N_d \end{bmatrix} = \begin{bmatrix} \frac{\partial N_a}{\partial C} & \frac{\partial N_a}{\partial M} & \frac{\partial N_a}{\partial Y} \\ \frac{\partial N_t}{\partial C} & \frac{\partial N_t}{\partial M} & \frac{\partial N_t}{\partial Y} \\ \frac{\partial N_d}{\partial C} & \frac{\partial N_d}{\partial M} & \frac{\partial N_d}{\partial Y} \end{bmatrix} \begin{bmatrix} \Delta C_r \\ \Delta M_g \\ \Delta Y_b \end{bmatrix} = \begin{bmatrix} S_{Na} \\ S_{Nt} \\ S_{Nd} \end{bmatrix} \begin{bmatrix} \Delta C_r \\ \Delta M_g \\ \Delta Y_b \end{bmatrix} \quad (12)$$

and (iv) for black solids and tints $$\Delta K_a = \frac{\partial K_a}{\partial K_n} \Delta K_n = S_n \Delta K_n \quad (13)$$

In essence, each of equations (9)–(13) characterizes the behavior of the proofing system as being locally linearized around a given operating point. The sensitivity coefficients are simply obtained through linear regression analysis of empirical measurements of the response of the proofing system to known changes in the operating point (i.e. given changes in C, Y, M and K solid area density and halftone dot size) within its color space. Actual illustrative values for the coefficients in the sensitivity matrices are provided in the associated pseudo-code below. We have determined that the values of the sensitivity coefficients are not critical. Proper convergence, i.e. within pre-defined convergence limits, will still occur even if relatively inaccurate sensitivity coefficients are used, though the model may require one or more additional iterations (i.e. additional proofs) to achieve it. Furthermore, rather than using local linearization, more complex equations, such as a local quadratic fit in the a-t-d color space, could be used to hasten convergence in some instances, particularly when a relatively large change in primary colorant densities is required for the proof; though this will necessarily complicate the model, such as through the inclusion of both first and second derivatives thereto. In general, the sensitivity coefficients will likely be different for each different halftone dot coverage level—though this dependence is not explicitly shown in equation (12). Furthermore, the appropriate sensitivity coefficients may also change based upon variations in the solid area density levels used to implement these models, thus requiring different sets of sensitivity coefficients for correspondingly different solid area density levels.

E. Methodology for Determining Proofing System Calibration Settings

Given the matching principles for the three-color overprints and the proofing system model, appropriate portions of model equations (9)–(11) are substituted as the response changes ($\Delta N_a$, $\Delta R_r$, $\Delta R_d$, $\Delta G_l$ and $\Delta G_d$) into equations (2)–(4) in order to express the matching principles directly in terms of the needed changes in the process color density values. The resulting set of linear equations is as follows:

$$\begin{bmatrix} S_{Na} \\ R_t^T S_{Rd} - R_d^T S_{Rt} \\ G_t^T S_{Gd} - G_d^T S_{Gt} \end{bmatrix} \begin{bmatrix} \Delta C_r \\ \Delta M_g \\ \Delta Y_b \end{bmatrix} = \begin{bmatrix} N_a^T - N_a^P \\ R_d^T R_t^P - R_t^T R_d^P \\ G_d^T G_t^P - G_t^T G_d^P \end{bmatrix} \quad (14)$$

Similarly, for the three-color overprint tints, appropriate portions of model equation (12) are substituted as the response changes ($\Delta N_a$, $\Delta N_t$, $\Delta N_d$) into equations (5)–(7) to yield the following equation:

$$\begin{bmatrix} S_{Na} \\ S_{Nt} \\ S_{Nd} \end{bmatrix} \begin{bmatrix} \Delta C_r \\ \Delta M_g \\ \Delta Y_b \end{bmatrix} = \begin{bmatrix} N_a^T - N_a^P \\ N_t^T - N_t^P \\ N_d^T - N_d^P \end{bmatrix} \quad (15)$$

Finally, for the black solid area and tint densities, equation (13) is used to substitute for the response change $\Delta K_a$ in equation (8) thereby resulting in the following equation for the changes in n-channel density of black:

$$S_n K_n = K_a^T - K_a^P \quad (16)$$

By relating the a-t-d coordinate differences for the process color overprints and solids between the proof and press sheet to changes in the process color densities, equations (14), (15) and (16) are used to yield an appropriate set of recommended changes in the process color densities in the proof in order to yield an appearance match between the proof and the press sheet.

In order to provide setting changes for tint density in terms of effective reflectance halftone dot area, i.e. the units commonly used to define tone reproduction in the printing trade, the recommended tint density changes arising from solution of equations (15) and (16) can be converted to dot area changes by a linearization of the well-known "Murray-Davies" dot area formula:

$$\text{DotArea} = 100 \frac{1 - 10^{(D_{min} - D_{tint})}}{1 - 10^{(D_{min} - D_{solid})}} \quad (17)$$

the linearization resulting in:

$$\Delta \text{DotArea} = \frac{\partial \text{DotArea}}{\partial D_{tint}} \Delta D_{tint} = S_{area} \Delta D_{tint} \quad (18)$$

Although evaluation of the sensitivity coefficient $S_{area}$ in equation (18) involves paper base density ($D_{min}$) and measured tint and solid densities in the appropriate channel (N, R, G or B for K, C, M or Y, respectively), a useful approximation for commonly used solid densities and tint densities of a 50% input dot area is that dot area changes (when expressed in percent) are approximately one hundred (100) times tint density changes, i.e. $S_{area} = 100$.

In order to utilize equations (14), (15), (16) and (18) to iteratively yield a set of recommended change values, the following measurements are obtained for each press sheet and corresponding proof:

(i) for the press sheet ("target")
Four channel "Status T" densitometer data for
 (a) R, G and three-color overprint and K solids;
 (b) three-color and black tints at, e.g., a 50% dot size; and
 (c) paper base;

(ii) for the proof
Four channel "Status T" densitometer data for
 (a) R, G, three-color overprint and K solids;
 (b) three-color and black tints at, e.g., a 50% dot size; and
 (c) paper base.

Through use of equations (14), (15), (16) and (18), the following steps are utilized to form an appearance match between a press sheet and a proof:

A. Obtain the densitometric data from a press sheet for the paper, three-color solids, the red and green solid (two-color) overprints, and one coverage level, such as a 50% halftone dot size, of three-color tints. In addition, obtain black scale data for the solids and tints from the press sheet.

B. Obtain corresponding densitometric data to that obtained in step A from a test proof.

C. Formulate equation (14) and solve for the recommended changes in solid area densities for the process colors C, Y and M.

D. Formulate equation (15) and solve for the recommended changes in tint densities for the process colors C, Y and M; use equation (18) to convert the tint density changes to dot area changes.

E. Solve equation (16) for the recommended changes in the solid and tint densities for black; use equation (18) to convert the tint density changes to dot area changes.

F. Generate a proof using the recommended setting changes provided through steps B–E.

G. Repeat steps B–F until an acceptable appearance match results between the most recent proof and the press sheet.

F. Hardware

Figure 3:
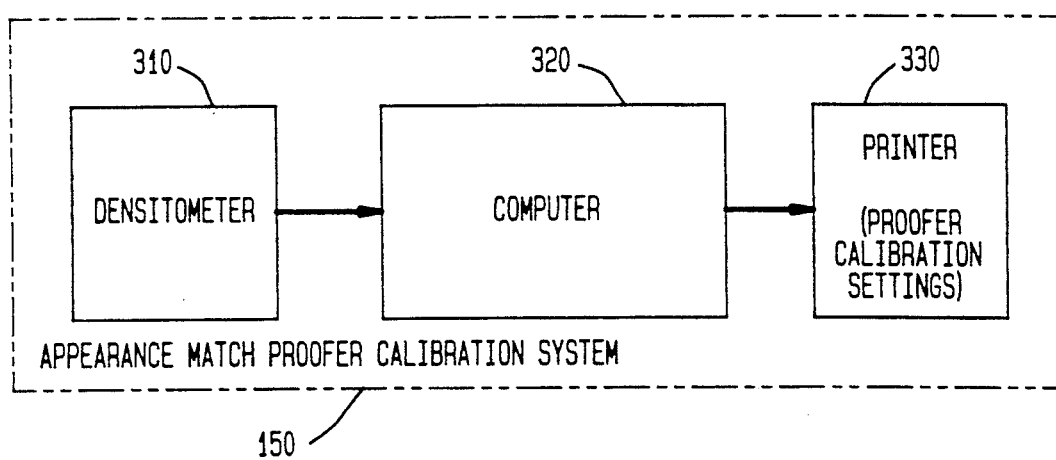
FIG. 3 depicts a block diagram of a preferred embodiment of our inventive Appearance Match Proofer Calibration System 150 shown in FIG. 1.

FIG. 3 depicts a block diagram of a preferred embodiment of our inventive Appearance Match Proofer Calibration System 150 shown in FIG. 1. As shown, system 150 is formed of densitometer 310, computer 320 and printer 330. The densitometer is illustratively an "X-Rite" type 408 Densitometer. The computer 320 can be any microprocessor based system, or even in very simple implementations a programmable scientific calculator such as a model HP48SX calculator manufactured by Hewlett Packard Company of Palo Alto, Calif. Under program control of the computer, the densitometer is manually and successively placed by a technician over each test patch on both the press sheet and the proof. For each patch, the densitometer generates an associated N,R,G,B "Status T" densitometric measurement thereof. This measurement, in conjunction with all the other such measurements, are processed by computer 320, according to the methodology set forth above and the following flowcharts and pseudo-code, to generate recommended changes in process color solid and tint densities. Once these changes are determined, the computer routes these changes to printer 330 which generates a hardcopy print-out thereof. The color technician then simply varies the settings on the proofing system by the specific amounts indicated on the print-out.

G. Software

We will now address the relevant software that can be used to implement our invention in a general purpose microcomputer system. By greatly simplifying the software through elimination of various features, such as database management and file editing, unrelated to solving equations (14), (15), (16) and (18), the invention can be practiced by appropriately programming a simple handheld scientific calculator. After discussing the flowcharts, we will present pseudo-code routines that can be used for implementing solutions to equations (14), (15), (16) and (18).

1. Flowcharts

Figure 4:
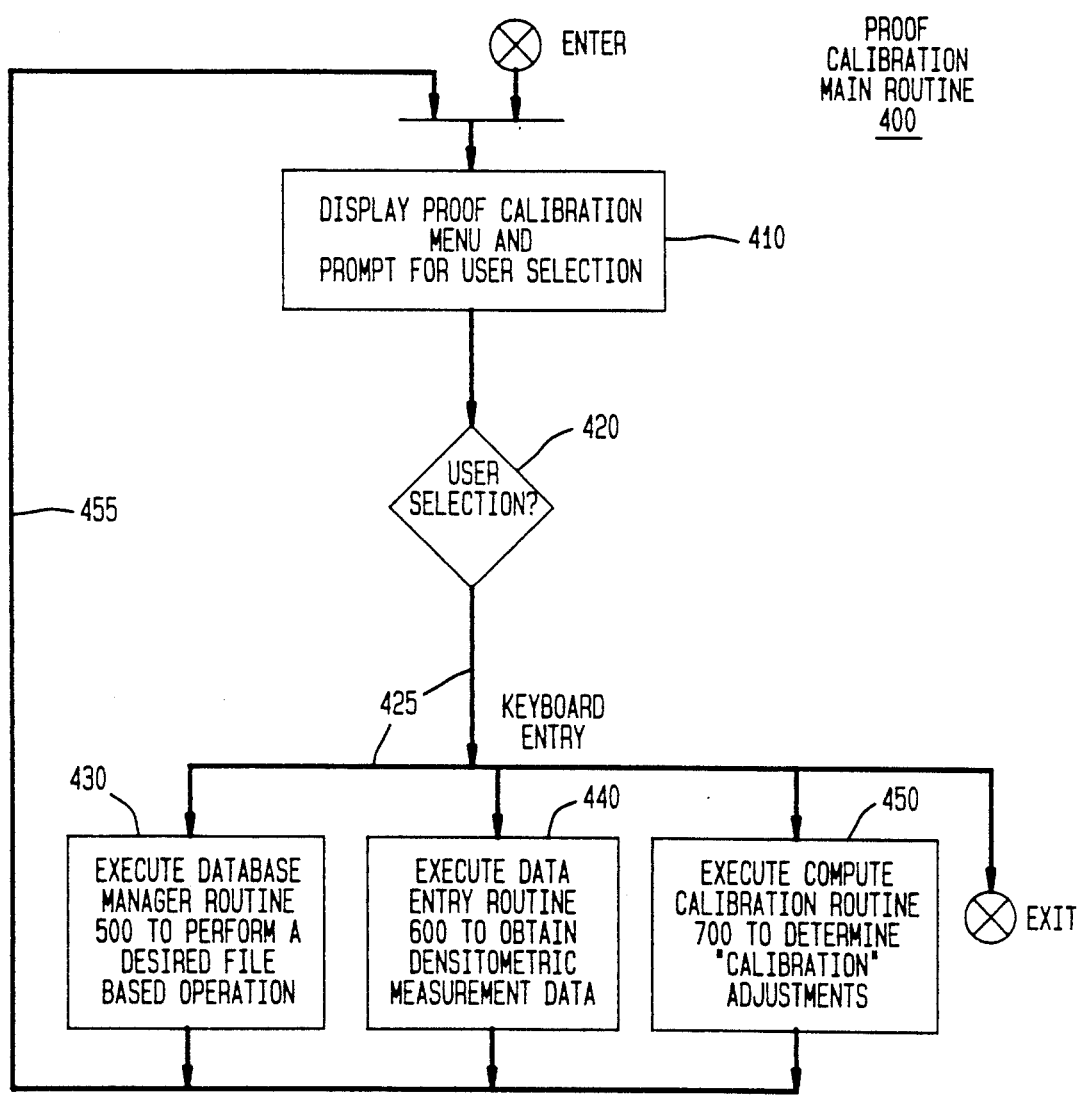
FIG. 4 depicts a flowchart of Proof Calibration Main Routine 400 that is executed within computer 320 shown in FIG. 3.
Figure 5:
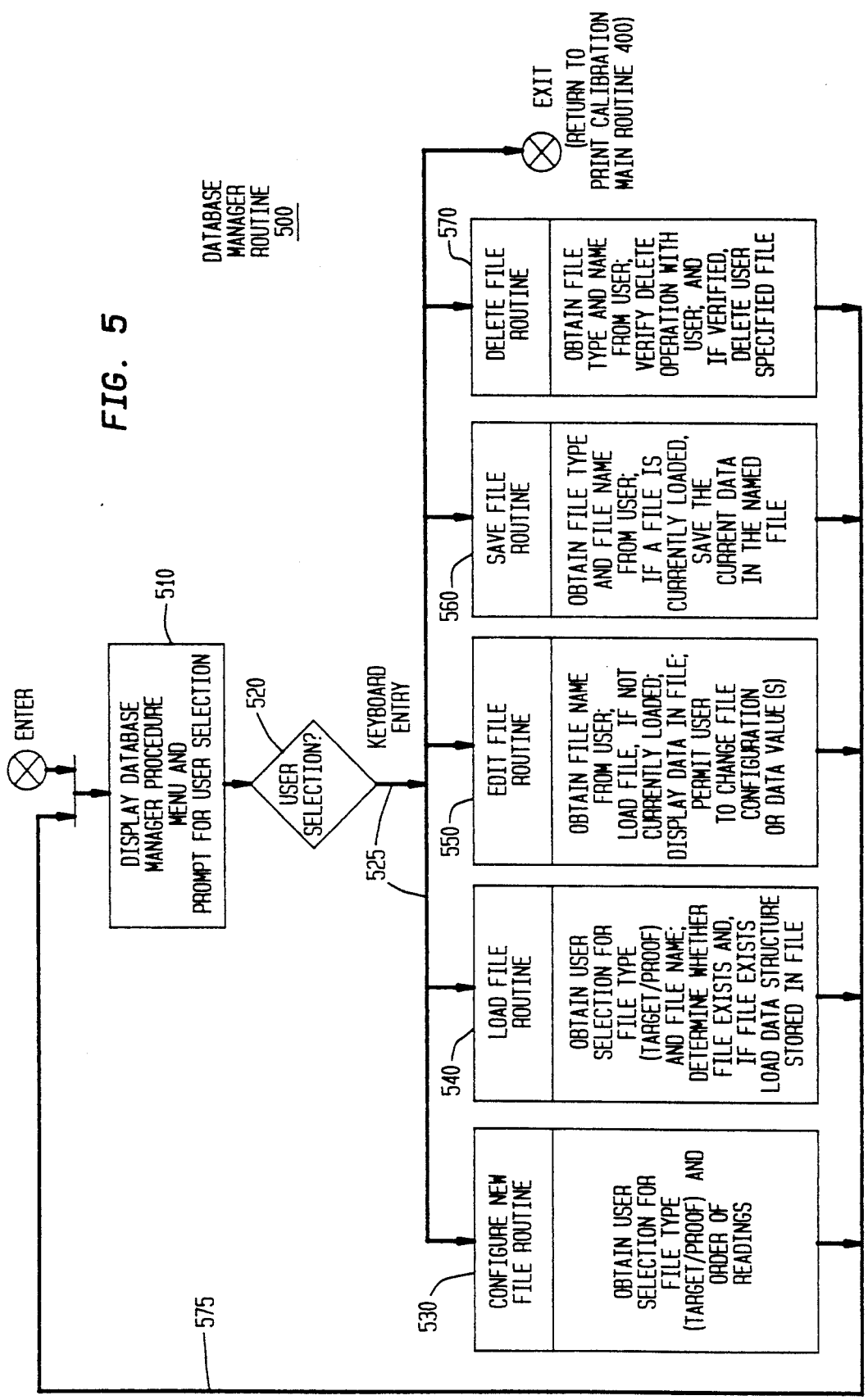
FIGS. 5 depicts a flowchart of Database Manager Routine 500 that is executed by routine 400 shown in FIG. 4.
Figure 6:
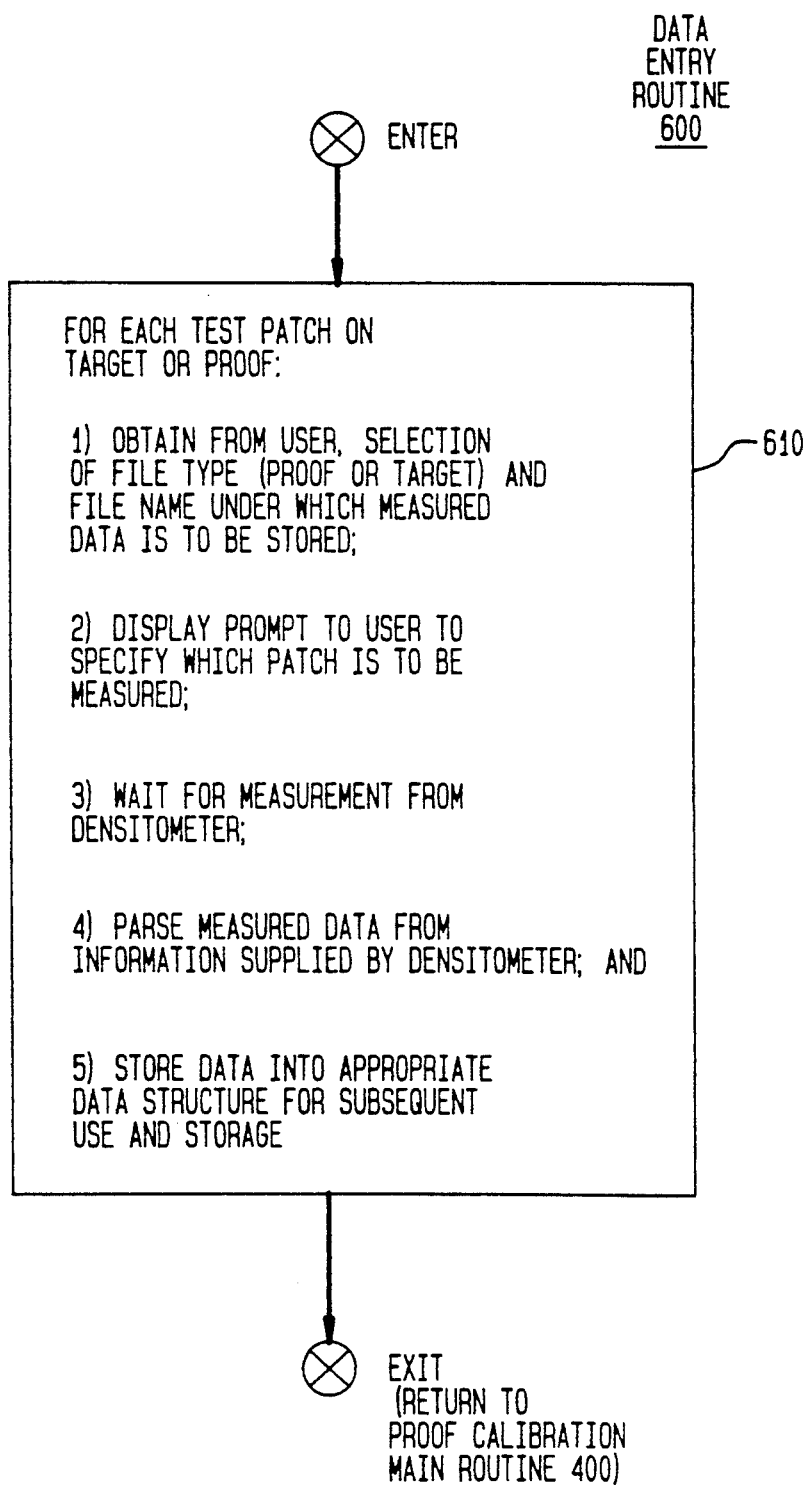
FIG. 6 depicts a flowchart of Data Entry Routine 600 that is also executed within routine 400 shown in FIG. 4.

FIG. 4 depicts our inventive process split into three high level separately executable processes for execution within computer 320 (shown in FIG. 3) by associated routines, as shown in FIGS. 5–7 and described in detail below, implemented through a menu based user interface.

In particular, FIG. 4 depicts a flowchart of Proof Calibration Main Routine 400 that is executed within computer 320 shown in FIG. 3. This routine creates a high level menu on a display screen at the computer and then initiates routines based upon user selection to perform desired portions of our inventive process.

Specifically, upon entry into routine 400, execution proceeds to block 410 which, when executed, displays a main menu on the display screen and prompts the user situated thereat to select an operation to be performed. Based upon a keyboard entry made by the user, decision block 420 then routes execution, via path 425, to any of blocks 430–450 or causes execution to exit both from this routine and the entire proof calibration process and return to a higher level operating procedure. Once any of blocks 430–450 has fully executed, execution merely loops back, via path 455, to block 410 to prompt the user for the next operation, and so on.

When executed, block 430 invokes Database Manager Routine 500 (shown in FIG. 5 and discussed in detail below) to permit a user to perform file manipulation operations: i.e. configure a new file for target or proof data, load a desired file, edit a desired file, save a particular file or delete a particular file.

Block 440, when executed, invokes Data Entry Routine 600 to obtain densitometric data for either a proof or a press sheet. This routine displays a message to the user specifying which particular patch is to be measured and on which image; waits for the user to appropriately position the densitometer over the patch, and then cause the densitometer to take a measurement, and for the densitometer to transmit a data string containing that measurement back to the computer; parses the measured values from the string; and stores the measured data value into an appropriate data structure.

Block 450, when executed, invokes Compute Calibration Routine 700 which, through implementing equations (14), (15), (16) and (18), determines the recommended changes in solid area density and tint dot areas based upon the measured data for a proof and press sheet.

FIGS. 5 depicts a flowchart of Database Manager Routine 500 that is executed by routine 400 shown in FIG. 4. As noted above, routine 500 permits the user to undertake any of a variety of file manipulation operations involving target or proof data.

Specifically, upon entry into routine 500, execution proceeds to block 510 which, when executed, displays a menu on the display screen and prompts the user situated thereat to select a particular operation to be performed. Based upon a keyboard entry made by the user, decision block 520 then routes execution, via path 525, to any of blocks 530–570 or causes execution to exit from this routine and return to Print Calibration Main Routine 400. Once any of blocks 530–570 has fully executed, execution merely loops back, via path 575, to block 510 to prompt the user for the next file manipulation operation, and so on.

Block 530 executes a configure new file routine. This routine prompts the user to specify whether the new file is to store target or proof measurements (readings) and the specific order in which the readings are to be subsequently taken within data entry routine 600.

Block 540 executes a load file routine. This routine prompts the user to specify the particular type of file, i.e. target or proof data, that is to be loaded, along with the name of the desired file. If the specified file, by name and type, exists, then this routine reads a data structure stored within that file. This data structure contains the measurements stored within the file. In this regard, the target file contains target identification information, followed by solid color measurement data followed by tint data. The solid color measurement data is formed of the paper base density adjusted "Status T" readings ($G_r$, $G_g$, $G_b$; $R_r$, $R_g$, $R_b$; $N_r$, $N_g$, $N_b$; $K_r$, $K_g$) or corresponding a-t-d transformed values ($G_t$, $G_d$; $R_t$; $R_d$; $N_a$, $K_a$). The tint data contains values which are the paper base density adjusted tint readings for the three-color overprints ($N_r$, $N_g$ and $N_b$) and for the black patches ($K_r$ and $K_g$, or, the corresponding a-t-d transformed value, $K_a$). The proof file contains proof identification information, followed by the same measurements but for the proof rather the press sheet.

Block 550 executes a file editor routine. This routine prompts the user for the name of a file to be edited. Once this name is so supplied, this routine loads the file, if it is not currently loaded. Thereafter, this routine displays the data contained in the file and allows the user to change a file configuration identification or provide a new value for any item(s) of the displayed data.

Block 560 executes a file save routine. This routine first obtains a file name and type from a user. If a file is currently loaded, this routine saves this file under this name and type.

Block 570 executes a file delete routine. In a similar fashion to the file save routine, the file delete routine first obtains a file name and type from a user. However, unlike the file save routine, the file delete routine then solicits user confirmation that a delete operation is to be performed. If this operation is confirmed, then the file delete routine deletes the specified file.

FIG. 6 depicts a flowchart of Data Entry Routine 600 that is also executed within routine 400 shown in FIG. 4. As noted above, routine 600, as shown in FIG. 6, obtains densitometric data for either a proof or a press sheet. This routine contains single block 610 which, when executed, performs several functions in succession. First, this block obtains from the user his selection of file type (target or proof) and a filename under which measured data is to be stored. Thereafter, this block displays a message to the user specifying which particular test patch is to be measured and on which image, i.e. the proof or the press sheet (target). Next, this routine waits for the densitometer to provide a data string containing the particular measurement value. While the routine is waiting, the technician properly positions the densitometer above the specified test patch and then causes the densitometer to undertake a measurement. After the data string is routed to the computer, block 610 parses the measured values from the string and thereafter stores these values in the appropriate target or proof data structure for subsequent use and storage. Once all the measurement data is obtained for either the press sheet or the proof, execution exits from block 610 and returns to proof calibration main routine 400.

Figure 7A:
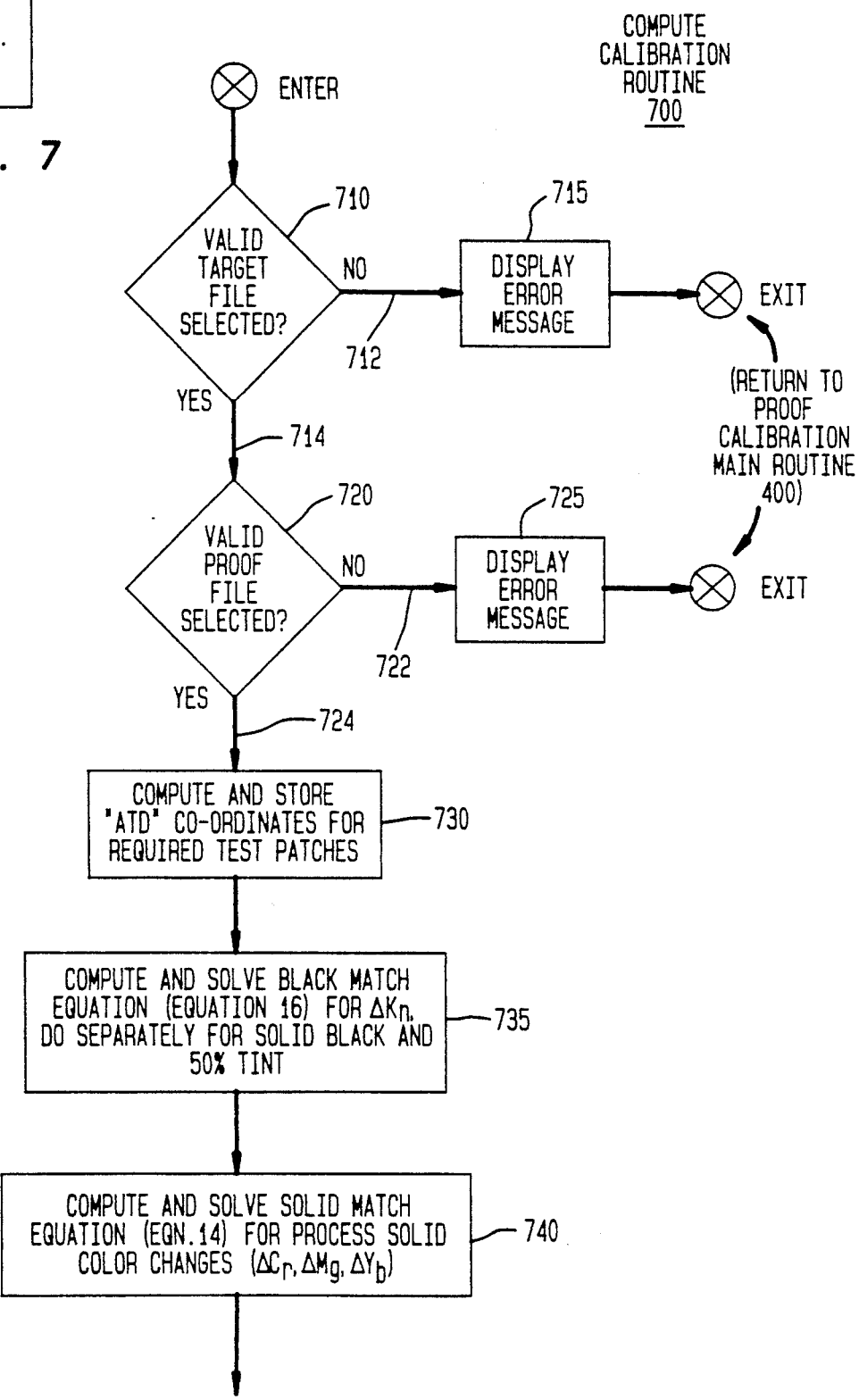

FIGS. 7A and 7B collectively depict a flowchart of Compute Calibration Routine 700 that is also executed by routine 400 shown in FIG. 4; the correct alignment of the drawing sheets for FIGS. 7A and 7B is shown in FIG. 7. As noted above, routine 700, through implementing equations (14), (15), (16) and (18), determines the recommended changes in solid area densities and tint dot areas based upon the measured data for a proof and a press sheet.

As shown, upon entry into routine 700, execution proceeds to decision block 710. This block determines whether the user has defined a valid target data structure, either via load file routine 540 or via data entry routine 600. If the target data structure is not yet defined, then an error condition has occurred. Accordingly, decision block 710 routes execution, via NO path 712, to block 715. This latter block when executed displays an appropriate error message to the user. Thereafter, execution exits from routine 700 and returns to proof calibration main routine 400. Alternatively, if a valid target data structure has been defined, then execution proceeds, via YES path 714, to decision block 720. This particular decision block determines if the user has defined a valid proof data structure, either via load file routine 540 or via data entry routine 600. If the proof data structure is not yet defined, then an error condition has occurred. Accordingly, decision block 720 routes execution, via NO path 722, to block 725. This latter block when executed displays an appropriate error message to the user. Thereafter, execution exits from routine 700 and returns to proof calibration main routine 400.

Otherwise, if a valid proof data structure has been defined, execution then proceeds from decision block 720, via YES path 724, to block 730. This latter block, when executed, transforms required stored r,g,b density values for the measurements of the test patches for both the target and the proof into corresponding a-t-d coordinates and then stores the results. Appropriate pseudo-code for this block is shown in Table 1 below and will be described shortly. Once all the coordinate conversion operations have occurred, block 735 is executed to separately compute and solve equation (16), i.e. the black match equation, for the solid and 50% tint black test patches in the target and press sheet. Appropriate pseudo-code for this block is shown in Table 2 below and will be described shortly.

After block 735 has fully executed, block 740 is executed to compute and solve equation (14) to determine recommended changes in the solid process colors. Appropriate pseudo-code for this block is shown in Table 3 below and will be described shortly. Upon completion of block 740, execution proceeds to block 745 to compute and solve equation (15), i.e. the tint match equation, for corresponding three-color tint patches (one in the proof and one in the target) in order to determine the current recommended changes in the tint process colors. Appropriate pseudo-code for block 745 is shown in Table 4 below and will be described shortly. Once the recommended process color tint density changes have been determined through block 745, block 750 is executed to convert the tint density changes into corresponding changes in halftone dot areas through use of equation (18).

As the last step within routine 700, once block 750 has fully executed, execution proceeds to block 755. This latter block displays, and if requested, prints the recommended changes in the operational settings of the solid area density and halftone dot size for each of the process colors. These changes are provided, for each of process colors C, Y, M and K, for an electro-photographic proofing system of the type shown in the U.S. Pat. No. '459 Cowan et al patent, in terms of "Status T" density units for the solid area density setpoints, and dot area units for the tint dot area. After these changes have been displayed and, if requested, printed, execution then exits from routine 700 and returns to proof calibration main routine 400.

2. Pseudo-code

The following pseudo-code procedure shown in Table 1 can be used, within block 730, to transform each measured "Status T" densitometric triplet (r,g,b) into a corresponding a-t-d color space triplet (a,t,d). This pseudo-code performs a simple linear mapping.

TABLE 1

```
Procedure Calculate_ATD_FROM_RGB
/*This procedure calculate ATD color space coordinates
   from RGB "Status T" densitometric values.
   variable names and meanings
      rgb(3)   vector containing r,g,b density data
      atd(3)   vector containing a,t,d coordinates     */
   atd(1) =   0.250 * rgb(1) + 0.750 * rgb(2);
   atd(2) = −0.866 * rgb(1) + 0.866 * rgb(2);
   atd(3) = −0.500 * rgb(1) − 0.500 * rgb(2) + rgb(3);
end;
         PSEUDO-CODE FOR A-T-D COORDINATE
                CALCULATION PROCEDURE
```

The following pseudo-code shown in Table 2 below can be used, within block 735, to calculate the recommended changes in solid and tint black density. Since the same equation, i.e. equation (16), is used to match both the solid and tint black densities between the proof and the press sheet, this pseudo-code is separately executed for each pair of black patches.

TABLE 2

```
Procedure Calculate_Recommended_Black_Density_Change
/*This procedure calculates recommended changes in black
  N densities to match the proof and press sheet (target)
  "a" coordinates.
  This procedure calculates the change for one test patch
  at a time in the proof.
     variable names and meanings
        Δk_n    recommended change in black N density
        k_a—target "a" coordinate of target black patch
        k_a—proof  "a" coordinate of proof black patch     */
  Δk_n = 1.0 * (k_a—target − k_a—proof);
end;
       PSEUDO-CODE FOR RECOMMENDED BLACK TINT
               DENSITY CHANGE PROCEDURE
```

The following pseudo-code shown in Table 3 below can be used, within block 740, to calculate, through formulation and direct solution of the combined process model and match principle inherent in equation (14), the recommended changes in the solid process colors C, M and Y based upon red and green (two-color overprint) hue angle matching and three-color (near neutral) "a" coordinate matching. This routine includes illustrative values of the corresponding sensitivity coefficients, S, for changes in the two-color (R and G) and three-color (N) overprints. As written, this routine takes advantage of the special structure of the coefficient matrix in the solution of equation (14).

TABLE 3

```
Procedure Calculate_Recommended_Solid_Density_Changes
/*This procedure implements the solid area match
  principles of matching red and green (two-color
  overprint) hue angle and 3-color "a" coordinate values.
```

TABLE 3-continued

```
  variable names and meanings
     G_d—roof    "d" coordinate of proof green solid
     G_t—roof    "t" coordinate of proof green solid
     R_d—roof    "d" coordinate of proof red solid
     R_t—proof   "t" coordinate of proof red solid
     N_a—proof   "a" coordinate of proof 3-color solid
     G_d—target  "d" coordinate of target (press sheet)
                 green solid
     G_t—target  "t" coordinate of target green solid
     R_d—target  "d" coordinate of target red solid
     R_t—target  "t" coordinate of target red solid
     N_a—target  "a" coordinate of target 3-color solid
     SG_d(3)     sensitivities of G_d to C_r, M_g, and Y_b
     SG_t(3)     sensitivities of G_t to C_r, M_g, and Y_b
     SR_d(3)     sensitivities of R_d to C_r, M_g, and Y_b
     SR_t(3)     sensitivities of R_t to C_r, M_g, and Y_b
     SN_a(3)     sensitivities of N_a to C_r, M_g, and Y_b
     mtx(3,3)    matrix of match principle coefficients
     err(3)      vector of match principle errors
     ΔY_b        recommended change in yellow density
     ΔM_g        recommended change in magenta density
     ΔC_r        recommended change in cyan density     */
  S_NA = [0.4, 0.8, 0.0];
  S_RT = [0.0, 0.7, 0.09];
  S_RD = [0.0, 0.08, 0.95];
  S_GT = [−0.65, 0.0, 0.07];
  S_GD = [−0.53, 0.0, 0.94];
  /*form matching matrix (G, R and N equations)*/
  for j = 1:3;
     mtx(1,j) = G_d—target*SG_t(j) − G_t—target*SG_d(j);
     mtx(2,j) = R_d—target*SR_t(j) − R_t—target*SR_d(j);
     mtx(3,j) = SN_a(j);
  end;
  /*form error vector (G, R and N errors) */
  err(1) = G_t—target*G_d—proof − G_d—target*G_t—proof;
  err(2) = R_t—target*R_d—proof − R_d—target*R_t—proof;
  err(3) = N_a—target − N_a—proof;
  /*use R and G equations to eliminate C and M terms in N
  equation*/
  mtx(3,3) = mtx(3,3) − mtx(3,1)*mtx(1,3)/mtx(1,1)
                      − mtx(3,2)*mtx(2,3)/mtx(2,2);
  err(3)   = err(3)   − mtx(3,1)*err(1)/mtx(1,1)
                      − mtx(3,2)*err(2)/mtx(2,2);
  /*solve resulting N equation for change in yellow*/
  ΔY_b = err(3)/mtx(3,3);
  /*use yellow change to solve G and R equations for cyan
  and magenta changes*/
  ΔM_g = (err(2) − mtx(2,3)*ΔY_b)/mtx(2,2);
  ΔC_r = (err(1) − mtx(1,3)*ΔY_b)/mtx(1,1);
end;
       PSEUDO-CODE FOR RECOMMENDED SOLID DENSITY
                    CHANGES PROCEDURE
```

The following pseudo-code shown in Table 4 below can be used, within block 745, to calculate, through direct solution of equation (15), the recommended changes in the tint densities for the process colors C, Y and M. Inasmuch as changes in the (r,g,b) density triplet of a three-color tint overprint are each primarily determined by changes in the red density of C, the green density of M and the blue density of Y, respectively, a useful approximation to the combined process model and match principle equation (15) is to replace the coefficient matrix with a trivially invertible identity matrix. The pseudo-code shown in Table 4 below includes this trivial definition of the inverse of the coefficient matrix, i.e. "tintinv"; nevertheless, the code for computing the resultant changes in $C_r$, $M_g$ and $Y_b$ is valid for a general inverse coefficient matrix.

TABLE 5

```
Procedure Calculate_Recommended_Tint_Density_Changes
/*This procedure calculates the recommended changes in C,
  Y and M tint densities to match the 3-color tint
  overprint R, G, B densities.
  This procedure calculates the changes for one test patch
  at a time in the proof.
```

TABLE 5-continued variable names and meanings

| | |
|---|---|
| tintinv | 3×3 matrix of inverse sensitivity (model) coefficients |
| $N_r$—target | red channel density target for 3-color tint |
| $N_g$—target | green channel density target for 3-color tint |
| $N_b$—target | blue channel density target for 3-color tint |
| $N_r$—proof | red channel density proof for 3-color tint |
| $N_g$—proof | green channel density proof for 3-color tint |
| $N_b$—proof | blue channel density proof for 3-color tint |
| $\Delta C_r$ | recommended change in cyan tint density |
| $\Delta M_g$ | recommended change in magenta tint density |
| $\Delta Y_b$ | recommended change in yellow tint density |
| err (3) | vector of density differences */ |

```
tintinv = [[1, 0, 0], [0, 1, 0], [0, 0, 1]];
ΔCr = 0.0;
ΔMg = 0.0;
ΔYb = 0.0;
err(1) = Nr—target − Nr—proof;
err(2) = Ng—target − Ng—proof;
err(3) = Nb—target − Nb—proof;
for j = 1:3;
    ΔCr = ΔCr + tintinv(1,j)*err(j);
    ΔMg = ΔMg + tintinv(2,j)*err(j);
    ΔYb = ΔYb + tintinv(3,j)*err(j);
end;
end;
```

PSEUDO-CODE FOR C, M, Y RECOMMENDED TINT DENSITY CHANGES PROCEDURE

Through experimentation using an electro-photographic proofing system of the type described in the U.S. Pat. No. '459 Cowan et al patent, we have found that, through use of our invention, the number of proofs needed to obtain an acceptable appearance match and thereby calibrate the proofing system to a press or to proofs from alternative proofing systems can be reduced from 12-15 successive proofs, as had traditionally occurred in the art, to between 2-4 such proofs (even with using somewhat inaccurate sensitivity coefficients) and in some instances to just one proof. As such, our method provides a significant savings in time, cost and material as well as requiring far less expertise of a technician than has heretofore been necessary. Furthermore, we have experimentally confirmed that our methodology does indeed produce a proof which matches a press sheet in terms of three-color overprint tone scale, critical aspects of three-color, red and green solids and a black printer tone scale—all of which together provide an acceptable appearance match.

By now it should be readily apparent to those skilled in the art that the broad principles of our invention are applicable to objectively obtaining an appearance match between two of a wide variety of different imaging systems and therethrough to calibrate the tone and color response characteristics of one of these systems to those of another such system. By doing so, a replica image, such as a proof as described above, made by one of these systems, e.g. a proofer, will be an accurate appearance match to a desired target, such as a press sheet, of that particular image but made by the other such system, such as illustratively a printing press. In order to calibrate any such system to another, the matching principles set forth above, in all likelihood, would need to be appropriately changed based on color response of the two systems and associated imaging media and the reproducible color gamuts obtainable therethrough as well as on the judgmental response of the observer. For example, rather than matching the three-color overprint solid achromatic value and tint r-g-b densities and two-color (for red and green) hue angle as described above, then, depending on the characteristics of the imaging systems, full scale three-color overprint r-g-b density matching (solid included) or alternatively full scale three-color overprint scaling coupled with red and green hue angle matching could be used. Furthermore, as different "replica" imaging systems and imaging media are used, the specific model that is used to represent the "replica" imaging system would also change in order to accurately characterize its response to changes in its operating conditions or settings. Such a change, for a localized linearized model, might entail use of different empirically determined sensitivity coefficients and/or different linearized equations given the process colorants that are to be used. Furthermore, if a more complicated model, such as quadratic, cubic or other localized fits or even non-localized modeling, were to be used, then the modeling equations and associated coefficients would change accordingly. Regardless of the specific model to be used, that model would be combined with appearance based matching principles in order to modify tone and color rendition produced in the replica according to these principles and the tone and color rendition obtained from a common source in the target so that, given the judgmental preferences of the observer and any performance limitations of the replica imaging system, the operational settings (and thereby the tone and color reproduction characteristics) of the replica imaging system would be altered in a manner which will produce a replica image that is an accurate appearance match to the target image. By combining the model and matching principles through feedback-based equations, a succession of replica images could be made for each target image so that the recommended process color values, either in relative (i.e. changes) or absolute magnitude terms will iteratively converge, within predefined convergence limits, to final values. As such, measurements would be taken of corresponding portions of a target image and the replica and fed back as input into the feedback-based equations to generate a new set of process color values. A new replica image would be generated using these values with appropriate measurements being taken of this image, and so on until the values appropriately converged. We fully expect that our inventive technique will likely provide operational settings that will produce an accurate objective appearance match, across many different imaging systems, in significantly less time and cost and requiring substantially less user expertise than trial-and-error methods currently in use or even quantified colorimetric techniques. Although appreciable time reductions occur even with use of relatively inaccurate models, convergence will occur in even less time (i.e. at an increased rate) and hence through use of fewer replica images as increasingly accurate models are used of the replica imaging system.

Although one embodiment of the present invention has been shown and described in detail herein, many other varied embodiments that incorporate the teachings of our invention may be easily constructed by those skilled in the art.

INDUSTRIAL APPLICABILITY AND ADVANTAGES

The present invention is useful in connection with a wide variety of different imaging systems, such as a color halftone proofing system, for objectively and automatically providing an appearance match between corresponding color images, such as a press sheet and a proof therefor, produced by two such differing systems. Through use of the invention in, for example, a proofing system, the tasks of establishing an appearance match between a press sheet and a corresponding proof and calibrating the proofing system to the press can both be accomplished in significantly less time, with significantly less cost and with significantly less expertise than have heretofore been required in the past.

We claim:

1. In imaging apparatus having first and second different imaging systems, wherein said first and second imaging systems generate respective first and second image depictions of a common original image, and said second imaging system has a variable response, a method for obtaining an appearance match between said first and second image depictions and for generating operational settings for varying the response of said second imaging system so as to calibrate a response of the second imaging system to a response of the first imaging system, the method comprising the steps of:

obtaining data values for corresponding portions of said first and second image depictions in a pre-determined manner that substantially parallels interpretative color preferences of a viewer; and determining, in response to said data values and through a pre-defined model of said second imaging system and pre-determined matching principles, operational settings for setting the response of said second imaging system to produce an image depiction, through said second imaging system, that is an appearance match to said first image depiction, wherein said matching principles comprise a plurality of pre-defined rules that collectively define an appearance match between corresponding image depictions produced by said first and second imaging systems in response to a common source image applied as a common input to both said first and second imaging systems.

2. The method of claim 1 wherein said data values obtaining step comprises the steps of:

obtaining measurement data for the corresponding portions of said first and second image depictions; and transforming said measurement data into a pre-defined coordinate system that represents color information in the predetermined manner to yield said data values.

3. The method of claim 2 wherein said imaging system comprises either a press or a first proofing system and said first image depiction comprises a target image; and said second imaging system comprises a second proofing system and said second image depiction comprises a proof image.

4. The method of claim 3 wherein said measurement data obtaining step comprises the step of densitometrically measuring corresponding portions of the proof image and the target image.

5. The method of claim 4 further comprising the steps of:

(a) obtaining, from associated portions of the target image, densitometric data for: media density, three-color solid overprint densities, red and green solid overprint densities, densities of a pre-defined half-tone dot size for three-color tints, and densities for a black solid and a black tint;

(b) obtaining, from corresponding portions of the proof image, densitometric data corresponding to all the densitometric data set forth in step (a) above;

(c) generating, through first associated corresponding ones of the densitometric data obtained through steps (a) and (b) above and in a first pre-defined manner, recommended changes in solid area densities for each of a plurality of process colors;

(d) generating, through second associated corresponding ones of the densitometric data obtained through steps (a) and (b) above and in a second pre-defined manner, recommended changes in halftone dot area size for each of the process colors;

(e) generating, through third associated corresponding ones of the densitometric data obtained through steps (a) and (b) above and in a third pre-defined manner, recommended changes for solid and black tint, respectively;

(f) generating the proof image, through the proofing system, using all the recommended changes provided through steps (b)–(e) above; and (g) repeating steps (b)–(f) above until an acceptable appearance match results between the target image and a most recent proof image.

6. The method in claim 5 wherein said measurement data transforming step comprises the step of converting each measurement triplet r-g-b (red, green, blue) value from r-g-b coordinate space into a corresponding a-t-d triplet value.

7. The method in claim 6 wherein said converting step utilizes the following equation:

$$\begin{bmatrix} a \\ t \\ d \end{bmatrix} = \begin{bmatrix} \frac{1}{4} & \frac{3}{4} & 0 \\ -\frac{\sqrt{3}}{2} & \frac{\sqrt{3}}{2} & 0 \\ -\frac{1}{2} & -\frac{1}{2} & 1 \end{bmatrix} \begin{bmatrix} r \\ g \\ b \end{bmatrix}.$$

8. The method in claim 5 wherein said pre-determined matching principles comprise:

(a) for cyan, yellow, and magenta solid process colors:

first matching "a" coordinate associated with ones of said data values for corresponding three-color solid overprint test patches in both the proof image and the target image;

second matching, in a "t-d" plane, a hue angle associated with ones of said data values for corresponding solid red test patches in both the proof image and the target image;

third matching, in a "t-d" plane, a hue angle associated with ones of said data values for corresponding solid green test patches in both the proof image and the target image; and (b) for three-color tint overprints:

fourth matching tint densities in either a-t-d or r-g-b coordinates at a given dot size for data values associated with corresponding three-color tint overprint test patches in both the proof image and the target image; and (c) for solid black and black tint:

fifth matching an "a" coordinate value in terms of "N-channel" density for data values associated with corresponding solid black and black tint test patches in both the proof image and the target image.

9. The method in claim 8 wherein said first matching step comprises the step of matching the "a" coordinate in the a-t-d coordinate space associated with said ones of said data values for the corresponding three-color overprint test patches in both the proof image and the target image according to the following equation:

$$N_a^T - (N_a^P + \Delta N_a) = 0$$

where:
- $N_a^P$ represents an "a" coordinate value for the near neutral overprint in the proof image;
- $N_a^T$ represents an "a" coordinate value for the near neutral overprint in the target image;
- $N_a$ represents a resulting correction needed in a three-color overprint "a" coordinate;

wherein said second and third matching steps comprise the steps of matching the hue angle associated with ones of said data values for the corresponding solid red and green test patches in both the proof image and the target image according to the following respective equations:

$$R_t^T(R_d^P + \Delta R_d) = R_d^T(R_t^P + \Delta R_t)$$

$$G_t^T(G_d^P + \Delta G_d) = G_d^T(G_t^P + \Delta G_t)$$

where:
- $R_t^T$ and $G_t^T$ represent "t" coordinate values for solid red and green test patches for the target image;
- $R_t^P$ and $G_t^P$ represent "t" coordinate values for solid red and green test patches for the proof image;
- $R_t$ and $G_t$ respectively represent a resulting correction needed in the red and green "t" coordinate values;
- $R_d^T$ and $G_d^T$ represent "d" coordinate values for solid red and green test patches for the target image;
- $R_d^P$ and $G_d^P$ represent "d" coordinate values for solid red and green test patches for the proof image; and
- $R_d$ and $G_d$ respectively represent a resulting correction needed in the red and green "d coordinate values;

wherein said fourth matching step comprises the step of matching the tint coordinates ($N_a$, $N_t$, $N_d$) for data values associated with the corresponding three-color overprint test patches in both the proof image and the target image according to the following equations evaluated at the given dot size:

$$N_a^T - (N_a^P + \Delta N_a) = 0$$

$$N_t^T - (N_t^P + \Delta N_t) = 0$$

$$N_d^T - (N_d^P + \Delta N_d) = 0$$

wherein said fifth matching step comprises the step of separately matching the "a" coordinate value for data values associated with the corresponding solid black and black tint test patches, the latter at the given dot size, in both the proof image and the target image, both according to the following equation:

$$K_a^T - (K_a^P + \Delta K_a) = 0$$

where:
- $K_a$ represents "N-channel" solid or tint black density; subscripts T or P representing the target image or proof image; and
- K represents a resulting correction in solid or tint black density, respectively.

10. The method in claim 9 wherein the given dot size is substantially 50%.

11. The method in claim 5 wherein the pre-defined model is a linearized model of the response of said second proofing system at a given operating point, said model comprising a plurality of sensitivity coefficients which collectively define changes in expected response of said second proofing system to pre-defined changes in said operating point.

12. The method in claim 11 wherein said changes in said operating point comprise changes in solid area density values of cyan, yellow, magenta or black process colors or halftone dot sizes associated with any of said process colors.

13. The method in claim 12 wherein said pre-defined model is given by the following equations:

(a) for three-color (red, green and blue) solid overprints:

$$\Delta N_a = [S_{Na}] \begin{bmatrix} \Delta C_r \\ \Delta M_g \\ \Delta Y_b \end{bmatrix}$$

where:
- $C_r$ represents the change in cyan process color solid area density for red light;
- $M_g$ represents the change in magenta process color solid area density for green light;
- $Y_b$ represents the change in yellow process color solid area density for blue light; and
- $N_a$ represents a resulting change in an "a" coordinate value for a three color overprint;

(b) for red and green solid colors:

$$\begin{bmatrix} \Delta G_t \\ \Delta G_d \end{bmatrix} = \begin{bmatrix} S_{Gt} \\ S_{Gd} \end{bmatrix} \begin{bmatrix} \Delta C_r \\ \Delta M_g \\ \Delta Y_b \end{bmatrix}$$

$$\begin{bmatrix} \Delta R_t \\ \Delta R_d \end{bmatrix} = \begin{bmatrix} S_{Rt} \\ S_{Rd} \end{bmatrix} \begin{bmatrix} \Delta C_r \\ \Delta M_g \\ \Delta Y_b \end{bmatrix}$$

where: G and R represent resulting changes in green and red coordinates (with subscripts "t" and "d" denoting the "t" and "d" coordinates, respectively);

(c) for three-color tint overprints $$\begin{bmatrix} \Delta N_a \\ \Delta N_t \\ \Delta N_d \end{bmatrix} = \begin{bmatrix} S_{Na} \\ S_{Nt} \\ S_{Nd} \end{bmatrix} \begin{bmatrix} \Delta C_r \\ \Delta M_g \\ \Delta Y_b \end{bmatrix}$$

and
(d) for black solids and tints:

$$\Delta K_a = S_n \Delta K_n$$

where:
- K represents a resulting change in an "a" coordinate value for black (K) solid or black tint density; and
- S represents a corresponding matrix of sensitivity coefficients for neutral ($S_n$), green ($S_G$), or red ($S_R$).

14. The method in claim 5 wherein said operational settings determining step comprises the step of determining, in response to differences in the measured data values for corresponding portions of said proof image and the target image, changes in process color solid area density values and halftone dot size through use of the following equations:

$$\begin{bmatrix} S_{Na} \\ R_t{}^T S_{Rd} - R_d{}^T S_{Rt} \\ G_t{}^T S_{Gd} - G_d{}^T S_{Gt} \end{bmatrix} \begin{bmatrix} \Delta C_r \\ \Delta M_g \\ \Delta Y_b \end{bmatrix} = \begin{bmatrix} N_a{}^T - N_a{}^P \\ R_d{}^T R_t{}^P - R_t{}^T R_d{}^P \\ G_d{}^T G_t{}^P - G_t{}^T G_d{}^P \end{bmatrix}$$

$$\begin{bmatrix} S_{Na} \\ S_{Nt} \\ S_{Nd} \end{bmatrix} \begin{bmatrix} \Delta C_r \\ \Delta M_g \\ \Delta Y_b \end{bmatrix} = \begin{bmatrix} N_a{}^T - N_a{}^P \\ N_t{}^T - N_t{}^P \\ N_d{}^T - N_d{}^P \end{bmatrix}$$

$$S_n \Delta K_n = K_a{}^T - K_a{}^P$$

$$\Delta DotArea = S_{area} \Delta D_{tint}$$

where:

$R_t{}^T$ and $G_t{}^T$ respectively represent "t" coordinate values for red and green solid areas for the target image;

$R_t{}^P$ and $G_t{}^P$ respectively represent "t" coordinate values for red and green solid areas for the proof image;

$R_d{}^T$ and $G_d{}^T$ respectively represent "d" coordinate values for red and green solid areas for the target image;

$R_d{}^P$ and $G_d{}^P$ respectively represent "d" coordinate values for red and green solid areas for the proof image;

DotArea represents a resulting change in dot area;

$S_{area}$ represents a sensitivity coefficient; and $D_{tint}$ represents a desired change in tint density.

15. Apparatus for use in conjunction with first and second different imaging systems, wherein said first and second imaging systems generate respective first and second image depictions of a common original image, and said second imaging system has a variable response, apparatus for obtaining an appearance match between said first and second image depictions and for generating operational settings for varying the response of said second imaging system so as to calibrate a response of the second imaging system to a response of the first imaging system, the apparatus comprising:

means for obtaining data values for corresponding portions of said first and second image depictions in a pre-determined manner that substantially parallels interpretative color preferences of a viewer; and means for determining, in response to said data values and through a pre-defined model of said second imaging system and pre-determined matching principles, operational settings for setting the response of said second imaging system to produce an image depiction, through said second imaging system, that is an appearance match to said first image depiction, wherein said matching principles comprise a plurality of pre-defined rules that collectively define an appearance match between corresponding image depictions produced by said first and second imaging systems in response to a common source image applied as a common input to both said first and second imaging systems.

16. The apparatus in claim 15 wherein said data values obtaining means comprises:

means for obtaining measurement data for the corresponding portions of said first and second image depictions; and means for transforming said measurement data into a pre-defined coordinate system that represents color information in the predetermined manner to yield said data values.

17. The apparatus in claim 16 wherein said first imaging system comprises either a press or a first proofing system and said first image depiction comprises a target image; and said second imaging system comprises a second proofing system and said second image depiction comprises a proof image.

18. The apparatus in claim 17 wherein said measurement data transforming means comprises means for converting each measurement triplet r-g-b (red, green, blue) value from r-g-b coordinate space into a corresponding a-t-d triplet value.

19. The apparatus in claim 18 wherein said converting means utilizes the following equation:

$$\begin{bmatrix} a \\ t \\ d \end{bmatrix} = \begin{bmatrix} \frac{1}{4} & \frac{3}{4} & 0 \\ -\frac{\sqrt{3}}{2} & \frac{\sqrt{3}}{2} & 0 \\ -\frac{1}{2} & -\frac{1}{2} & 1 \end{bmatrix} \begin{bmatrix} r \\ g \\ b \end{bmatrix}$$

20. The apparatus in claim 17 wherein said pre-determined matching principles comprise:

(a) for cyan, yellow, and magenta solid process colors:

first matching an "a" coordinate associated with ones of said data values for corresponding three-color solid overprint test patches in both the proof image and the target image;

second matching, in a "t-d" plane, a hue angle associated with ones of said data values for corresponding solid red test patches in both the proof image and the target image;

third matching, in a "t-d" plane, a hue angle associated with ones of said data values for corresponding solid green test patches in both the proof image and the target image; and (b) for three-color tint overprints:

fourth matching tint densities in either a-t-d or r-g-b coordinates at a given dot size for data values associated with corresponding three-color tint overprint test patches in both the proof image and the target image; and (c) for solid black and black tint;

fifth matching an "a" coordinate value in terms of "N-channel" density for data values associated with corresponding solid black and black tint test patches in both the proof image and the target image.

21. The apparatus in claim 17 wherein the pre-defined model is a linearized model of the response of said second proofing system at a given operating point, said model comprising a plurality of sensitivity coefficients which collectively define changes in expected response of said second proofing system to pre-defined changes in said operating point.

22. The apparatus in claim 21 wherein said changes in said operating point comprise changes in solid area density values of cyan, yellow, magenta or black process colors or halftone dot sizes associated with any one of said process colors.

23. The apparatus in claim 22 wherein said predefined model is given by the following equations:

(a) for three-color (red, green and blue) solid overprints:

$$\Delta N_a = [S_{Na}] \begin{bmatrix} \Delta C_r \\ \Delta M_g \\ \Delta Y_b \end{bmatrix}$$

where:
$C_r$ represents the change in cyan process color solid area density for red light;
$M_g$ represents the change in magenta process color solid area density for green;
$Y_b$ represents the change in yellow process color solid area density for blue; and
$N_a$ represents a resulting change in an "a" coordinate value for a three color overprint;

(b) for red and green solid colors:

$$\begin{bmatrix} \Delta G_t \\ \Delta G_d \end{bmatrix} = \begin{bmatrix} S_{Gt} \\ S_{Gd} \end{bmatrix} \begin{bmatrix} \Delta C_r \\ \Delta M_g \\ \Delta Y_b \end{bmatrix}$$

$$\begin{bmatrix} \Delta R_t \\ \Delta R_d \end{bmatrix} = \begin{bmatrix} S_{Rt} \\ S_{Rd} \end{bmatrix} \begin{bmatrix} \Delta C_r \\ \Delta M_g \\ \Delta Y_b \end{bmatrix}$$

where: G and R represent resulting changes in green and red coordinates (with subscripts "t" and "d" denoting the "t" and "d" coordinates, respectively);

(c) for three-color tint overprints $$\begin{bmatrix} \Delta N_a \\ \Delta N_t \\ \Delta N_d \end{bmatrix} = \begin{bmatrix} S_{Na} \\ S_{Nt} \\ S_{Nd} \end{bmatrix} \begin{bmatrix} \Delta C_r \\ \Delta M_g \\ \Delta Y_b \end{bmatrix}$$

and
(d) for black solids and tints:

$$\Delta K_a = S_n \Delta K_n$$

where:
K represents a resulting change in an "a" coordinate value for black (K) solid or black tint density; and
S represents a corresponding matrix of sensitivity coefficients for neutral ($S_n$), green ($S_G$), or red ($S_R$).

24. The apparatus in claim 17 wherein said operational settings determining means comprises means for determining, in response to differences in the measured data values for corresponding portions of said proof image and the target image, changes in process color solid area density values and halftone dot size through use of the following equations:

$$\begin{bmatrix} S_{Na} \\ R_t^T S_{Rd} - R_d^T S_{Rt} \\ G_t^T S_{Gd} - G_d^T S_{Gt} \end{bmatrix} \begin{bmatrix} \Delta C_r \\ \Delta M_g \\ \Delta Y_b \end{bmatrix} = \begin{bmatrix} N_a^T - N_a^P \\ R_d^T R_t^P - R_t^T R_d^P \\ G_d^T G_t^P - G_t^T G_d^P \end{bmatrix}$$

$$\begin{bmatrix} S_{Na} \\ S_{Nt} \\ S_{Nd} \end{bmatrix} \begin{bmatrix} \Delta C_r \\ \Delta M_g \\ \Delta Y_b \end{bmatrix} = \begin{bmatrix} N_a^T - N_a^P \\ N_t^T - N_t^P \\ N_d^T - N_d^P \end{bmatrix}$$

$$S_n \Delta K_n = K_a^T - K_a^P$$

$$\Delta DotArea = S_{area} \Delta D_{tint}$$

where:
$R_t^T$ and $G_t^T$ respectively represent "t" coordinate values for red and green solid areas for the target image;
$R_t^P$ and $G_t^P$ respectively represent "t" coordinate values for red and green solid areas for the proof image;
$R_d^T$ and $G_d^T$ respectively represent "d" coordinate values for red and green solid areas for the target image;
$R_d^P$ and $G_d^P$ respectively represent "d" coordinate values for red and green solid areas for the proof image;
DotArea represents a resulting change in dot area;
$S_{area}$ represents a sensitivity coefficient; and
$D_{tint}$ represents a desired change in tint density.

* * * * *